(12) United States Patent
Lee et al.

(10) Patent No.: US 11,189,572 B2
(45) Date of Patent: Nov. 30, 2021

(54) MAINTAINING HEIGHT OF ALIGNMENT KEY IN SEMICONDUCTOR DEVICES

(71) Applicant: SAMSUNG ELECTRONICS CO., LTD., Suwon-si (KR)

(72) Inventors: Kyung-Tae Lee, Seoul (KR); Seung-Hoon Choi, Yongin-si (KR); Min-Chan Gwak, Hwaseong (KR); Ja-Eung Koo, Yongin-si (KR); Sang-Hyun Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 435 days.

(21) Appl. No.: 16/383,816

(22) Filed: Apr. 15, 2019

(65) Prior Publication Data

US 2020/0027842 A1    Jan. 23, 2020

(30) Foreign Application Priority Data

Jul. 17, 2018  (KR) .......................... 10-2018-0083152

(51) Int. Cl.
| | | |
|---|---|---|
| *H01L 23/544* | (2006.01) | |
| *H01L 29/78* | (2006.01) | |
| *H01L 29/417* | (2006.01) | |
| *H01L 29/51* | (2006.01) | |
| *H01L 29/423* | (2006.01) | |

(52) U.S. Cl.
CPC ...... *H01L 23/544* (2013.01); *H01L 29/41791* (2013.01); *H01L 29/42364* (2013.01); *H01L 29/51* (2013.01); *H01L 29/785* (2013.01); *H01L 2223/54426* (2013.01)

(58) Field of Classification Search
CPC ...................................... H01L 23/544
See application file for complete search history.

(56) References Cited

U.S. PATENT DOCUMENTS

| | | | |
|---|---|---|---|
| 6,043,133 | A | 3/2000 | Jang et al. |
| 2005/0014330 | A1 | 1/2005 | Park et al. |
| 2008/0054484 | A1 | 3/2008 | Shim |
| 2008/0318389 | A1 | 12/2008 | Kim |

FOREIGN PATENT DOCUMENTS

| | | |
|---|---|---|
| KR | 1998-045163 A | 9/1998 |
| KR | 10-2005-0008364 A | 1/2005 |
| KR | 10-0567892 B1 | 4/2006 |
| KR | 10-0783639 B1 | 12/2007 |
| KR | 10-0816248 B1 | 3/2008 |

*Primary Examiner* — Marvin Payen
(74) *Attorney, Agent, or Firm* — Sughrue Mion, PLLC

(57) ABSTRACT

A semiconductor device may include a gate electrode structure on a first region of a substrate including the first region and a second region, a capping structure covering an upper surface of the gate electrode structure, the capping structure including a capping pattern and a first etch stop pattern covering a lower surface and a sidewall of the capping pattern, an alignment key on the second region of the substrate, the alignment key including an insulating material, and a filling structure on the second region of the substrate, the filling structure covering a sidewall of the alignment key, and including a first filling pattern, a second filling pattern covering a lower surface and a sidewall of the first filling pattern and a second etch stop pattern covering a lower surface and a sidewall of the second filling pattern.

20 Claims, 25 Drawing Sheets

FIG. 2
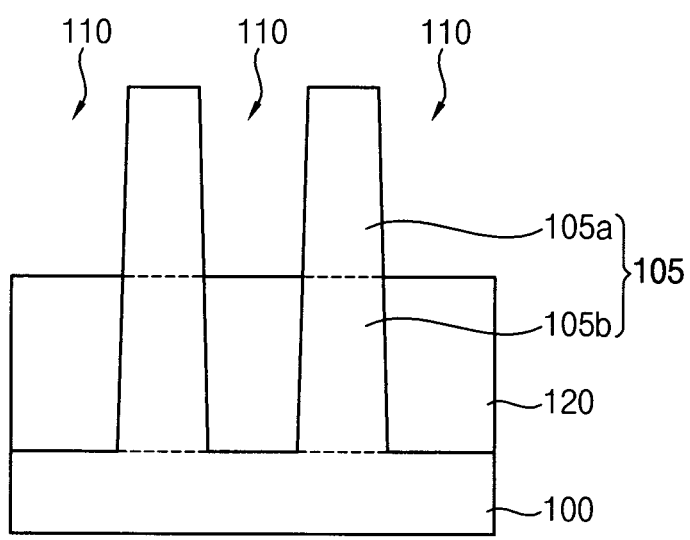
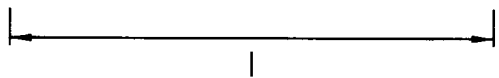

FIG. 6
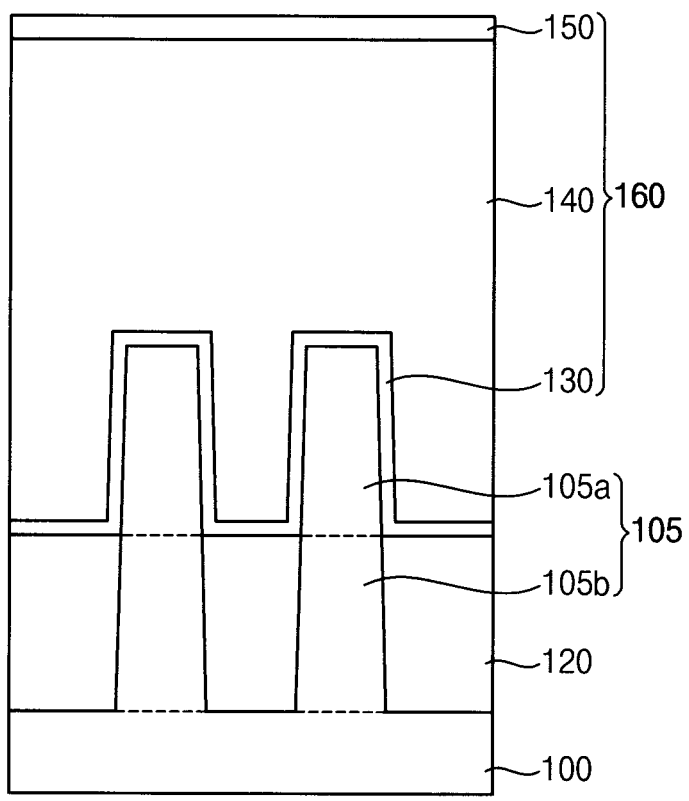
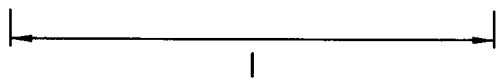

MAINTAINING HEIGHT OF ALIGNMENT KEY IN SEMICONDUCTOR DEVICES

CROSS-REFERENCE TO RELATED APPLICATION

This application claims priority under 35 USC § 119 to Korean Patent Application No. 10-2018-0083152, filed on Jul. 17, 2018, in the Korean Intellectual Property Office (KIPO), the contents of which are herein incorporated by reference in their entirety.

BACKGROUND

1. Field

Embodiments of the disclosure relate to a semiconductor device. More particularly, embodiments of the disclosure relate to a semiconductor device including a capping layer, which may cover an upper surface of a conductive pattern.

2. Description of the Related Art

In manufacturing a semiconductor device, when an alignment key is formed by patterning an insulation layer, a height of the alignment key should be maintained throughout the entire manufacturing process. However, for example, in a polishing process performed after patterning the insulation layer, most of the alignment key may be removed and an original height thereof may not be maintained. Accordingly, the alignment key may not properly function due to the altered height thereof.

SUMMARY

Embodiments of the disclosure provide a semiconductor device having improved characteristics.

According to an embodiment, there is provided a semiconductor including a gate electrode structure disposed on a substrate, a capping structure covering an upper surface of the gate electrode structure, the capping structure including a capping pattern and a first etch stop pattern covering a lower surface and a sidewall of the capping pattern, an alignment key disposed on the substrate, the alignment key including an insulating material, and a filling structure disposed on the substrate, the filling structure covering a sidewall of the alignment key, and including a first filling pattern, a second filling pattern covering a lower surface and a sidewall of the first filling pattern and a second etch stop pattern covering a lower surface and a sidewall of the second filling pattern.

According to an embodiment, there is provided a semiconductor device including a conductive structure disposed on a substrate, a capping structure covering an upper surface of the conductive structure, the capping structure including a capping pattern containing a silicon oxycarbide (SiOC) and a first etch stop pattern covering a lower surface and a sidewall of the capping pattern, the first etch stop pattern containing a material, which may have a first etching selectivity with respect to the capping pattern, an alignment key on the substrate, the alignment key containing a material having a second etching selectivity lower than the first etching selectivity with respect to the capping pattern, and a filling structure disposed on the substrate, the filling structure covering a sidewall of the alignment key, and including a first filling pattern, a second filling pattern covering a lower surface and a sidewall of the first filling pattern, the second filling pattern containing the same material as the capping pattern and a second etch stop pattern covering a lower surface and a sidewall of the second filling pattern, the second etch stop pattern containing the same material as the first etch stop pattern.

According to an embodiment, there is provided a semiconductor device including an active region disposed on a substrate, the active region defined by an isolation pattern, which may be formed on the substrate, a gate electrode structure on the active region and the isolation pattern, a capping structure covering an upper surface of the gate electrode structure, the capping structure including a capping pattern containing a silicon oxycarbide (SiOC) and an etch stop pattern covering a lower surface and a sidewall of the capping pattern, the etch stop pattern containing a material, which may include a silicon nitride (SiN), a silicon oxynitride (SiON) or a silicon carbonitride (SiCN), and a source/drain layer on the active region adjacent to the gate electrode structure.

In a method of manufacturing a semiconductor device in accordance with embodiments of the disclosure, an alignment key may not be removed in a CMP process, or the like. Therefore, the original height of the alignment key may be maintained, and thus the semiconductor device may secure elements having an original size and shape.

However, the embodiments may not be limited to the above-described effects, and may be variously extended without departing from the scope of the present disclosure.

BRIEF DESCRIPTION OF THE DRAWINGS

FIGS. 1, 2, 3, 4, 5, 6, 7, 8, 9, 10, 11, 12, 13, 14, 15, 16, 17, 18, 19, and 20 are plan views and cross-sectional views illustrating stages of a method of manufacturing a semiconductor device in accordance with embodiments of the disclosure.

DESCRIPTION OF EMBODIMENTS

A semiconductor device in accordance with embodiments of the disclosure will be described more fully hereinafter with reference to the accompanying drawings.

FIGS. 1 to 20 are plan views and cross-sectional views illustrating stages of a method of manufacturing a semiconductor device in accordance with embodiments of the disclosure. Particularly, FIGS. 1, 4, 7, 10 and 13 are plan views, and FIGS. 2 to 3, 5 to 6, 8 to 9, 11 to 12 and 14 to 20 are cross-sectional views.

FIGS. 2, 8, 11 and 14 are cross-sectional views taken along lines A-A' of corresponding plan views, respectively, FIGS. 3, 5, 9, 12 and 15 to 20 are cross-sectional views taken along lines B-B' of corresponding plan views, respectively, and FIG. 6 is a cross-sectional view taken along a line C-C' of a corresponding plan view.

Figure 1:
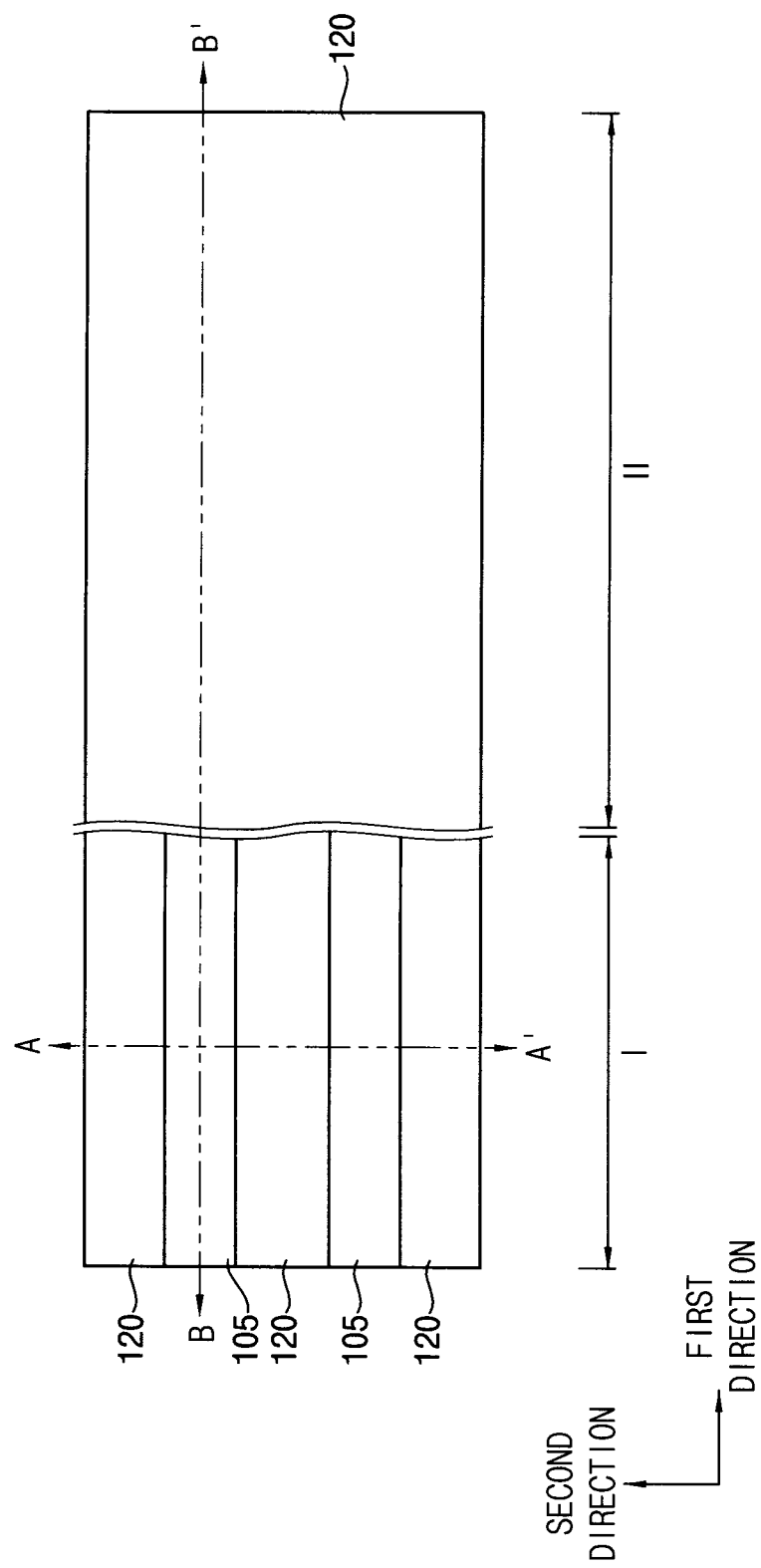
Figure 3:
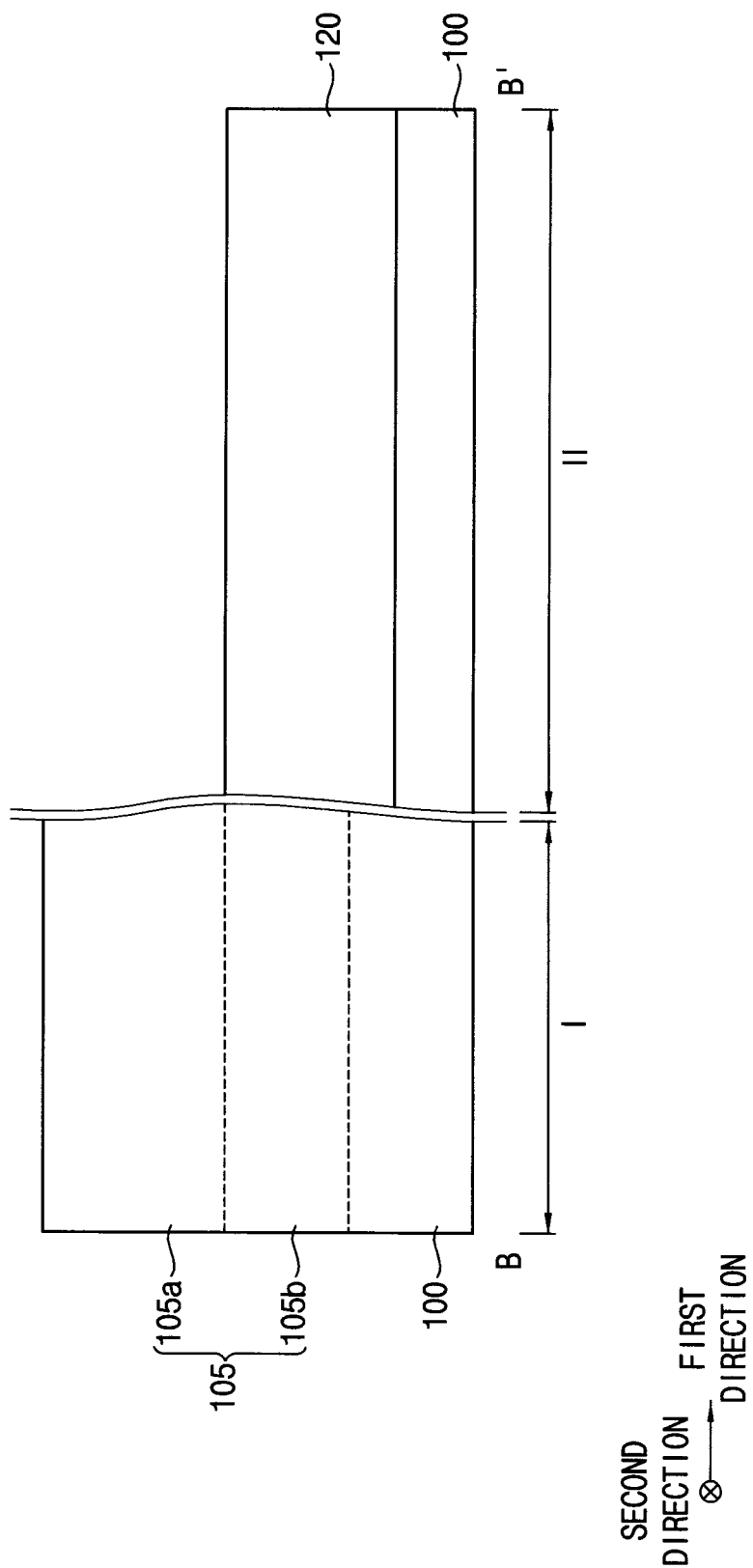

Referring to FIGS. 1 to 3, an upper portion of a substrate 100 including first and second regions I and II may be partially etched to form an active fin 105. Accordingly, the active fin 105 may protrude in a vertical direction substantially perpendicular to an upper surface of the substrate 100, and may include a material substantially the same as material of the substrate 100.

The substrate 100 may include semiconductor materials, e.g., silicon, germanium, silicon-germanium, etc., or III-V compounds e.g., GaP, GaAs, GaSb, etc. In some embodiments, the substrate 100 may be a silicon-on-insulator (SOI) substrate or a germanium-on-insulator (GOI) substrate.

In embodiments of the disclosure, the first region I of the substrate 100 may be a chip region on which devices are formed, and the second region II of the substrate 100 may be a scribe lane region surrounding the chip region. Alternatively, each of the first and second regions I and II of the substrate 100 may be a portion of a chip region on which devices are formed.

In embodiments of the disclosure, the upper portion of the substrate 100 may be etched using a first etching mask to form the active fin 105. The active fin 105 may extend in a first direction substantially parallel to the upper surface of the substrate 100, and a plurality of active fins 105 may be formed in a second direction substantially parallel to the upper surface of the substrate 100 and intersecting with the first direction. In embodiments of the disclosure, the first and second directions may be orthogonal to each other.

A first recess 110 may be formed between the active fins 105 in the second direction. That is, the active fins 105 may be spaced apart from each other in the second direction by at least the width of the first recess 110.

One or ones of the active fins 105 may be etched using a second etching mask to be removed. During the etching process, a portion of the substrate 100 under the removed one or ones of the active fins 105 may be also partially removed. In embodiments of the disclosure, one or more of the active fins 105 in the first region I of the substrate 100 and all of the active fins 105 in the second region II of the substrate 100 may be removed.

An isolation layer 120 may be formed on the substrate 100 to fill the first recess 110 and cover the remaining ones of the active fins 105, and an upper portion of the isolation layer may be removed to expose an upper portion of each of the active fins 105, so that and an isolation pattern 120 may be formed to fill a gap between the fins 105 and formed on top of the first recess 110 on the first region I of the substrate 100 and cover the second region II of the substrate 100.

The isolation layer may include an oxide, e.g., silicon oxide. In embodiments of the disclosure, an upper portion of the isolation layer may be removed by a chemical mechanical polishing (CMP) process and an etch back process.

As the isolation pattern 120 is formed, the active fin 105 may include a lower active pattern 105b of which a sidewall may be surrounded by the isolation pattern 120, and an upper active pattern 105a protruding from an upper surface of the isolation pattern 120 in the vertical direction.

Figure 4:
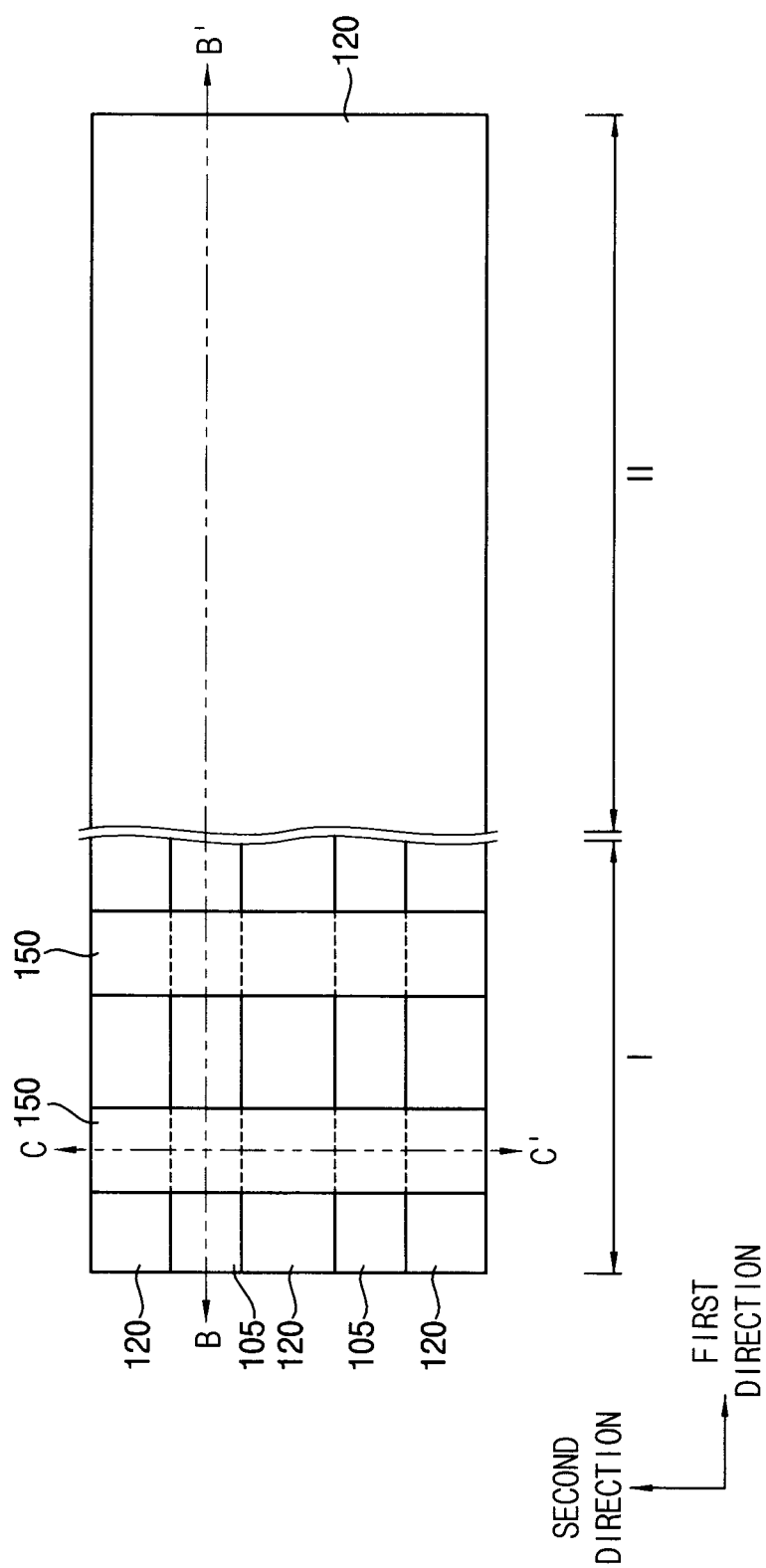
Figure 5:
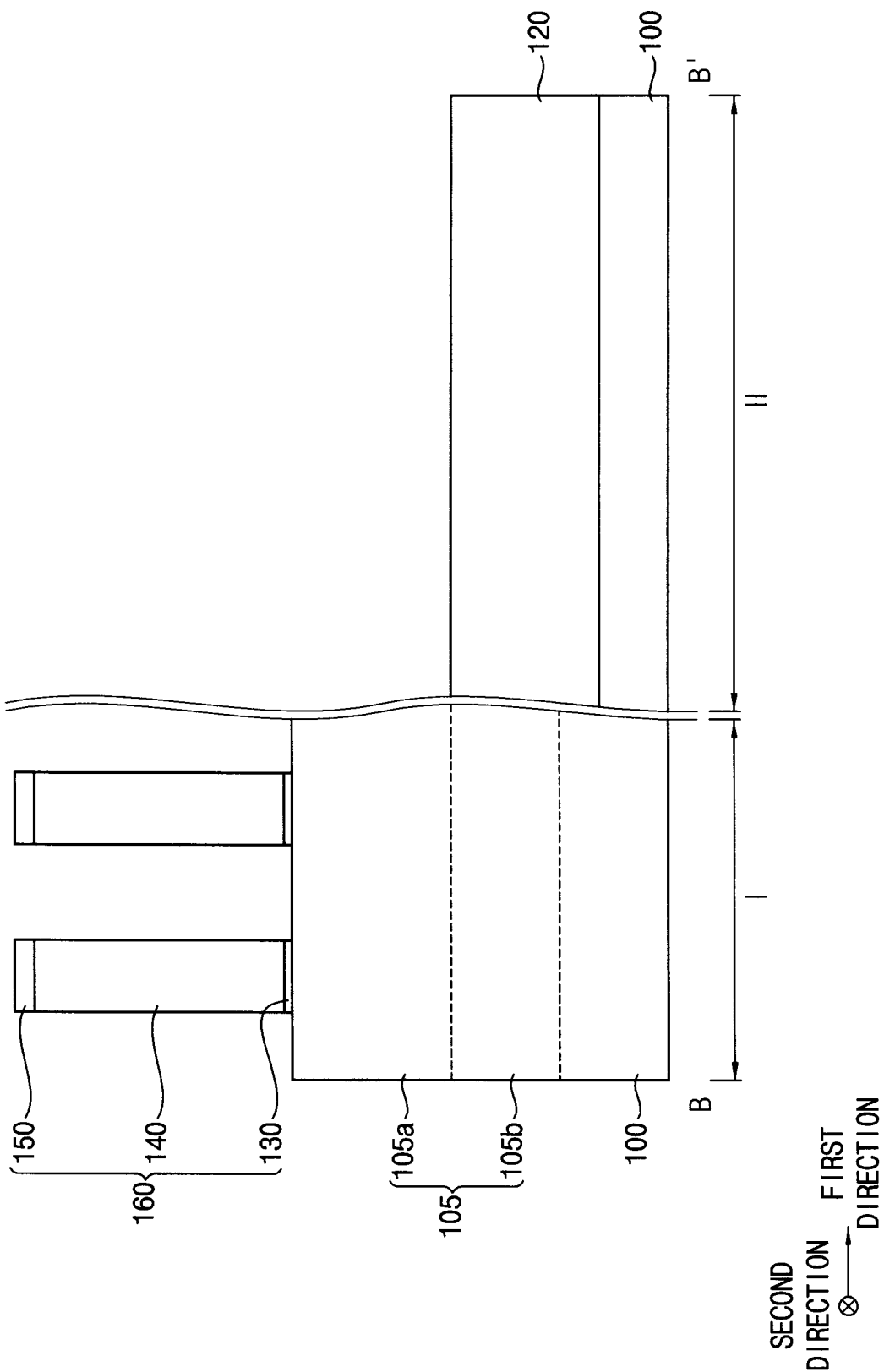

Referring to FIGS. 4 to 6, a dummy gate structure 160 may be formed on the active fin 105 and the isolation pattern 120.

The dummy gate structure 160 may be formed by sequentially forming a dummy gate insulation layer, a dummy gate electrode layer and a dummy gate mask layer on the active fin 105 and the isolation pattern 120, by patterning the dummy gate mask layer to form a dummy gate mask 150, and by sequentially etching the dummy gate electrode layer and the dummy gate insulation layer using the dummy gate mask 150.

Accordingly, the dummy gate structure 160 including a dummy gate insulation pattern 130, a dummy gate electrode 140 and the dummy gate mask 150 sequentially stacked on each other may be formed on the substrate 100.

The dummy gate insulation layer may include an oxide, e.g., silicon oxide. The dummy gate electrode layer may include, e.g., polysilicon. The dummy gate mask layer may include a nitride, e.g., silicon nitride.

The dummy gate insulation layer may be formed by, e.g., a chemical vapor deposition (CVD) process, an atomic layer deposition (ALD) process, etc. Alternatively, the dummy gate insulation layer may be formed by a thermal oxidation process on the upper active pattern 105a of the active fin 105, and in this case, the dummy gate insulation layer may be formed only on an upper surface of the upper active pattern 105a. The dummy gate electrode layer and the dummy gate mask layer may be also formed by, e.g., a CVD process, an ALD process, etc.

In embodiments of the disclosure, the dummy gate structure 160 may extend in the first region I of the substrate 100 in the second direction, and a plurality of dummy gate structures 160 may be formed in the first direction.

Figure 7:
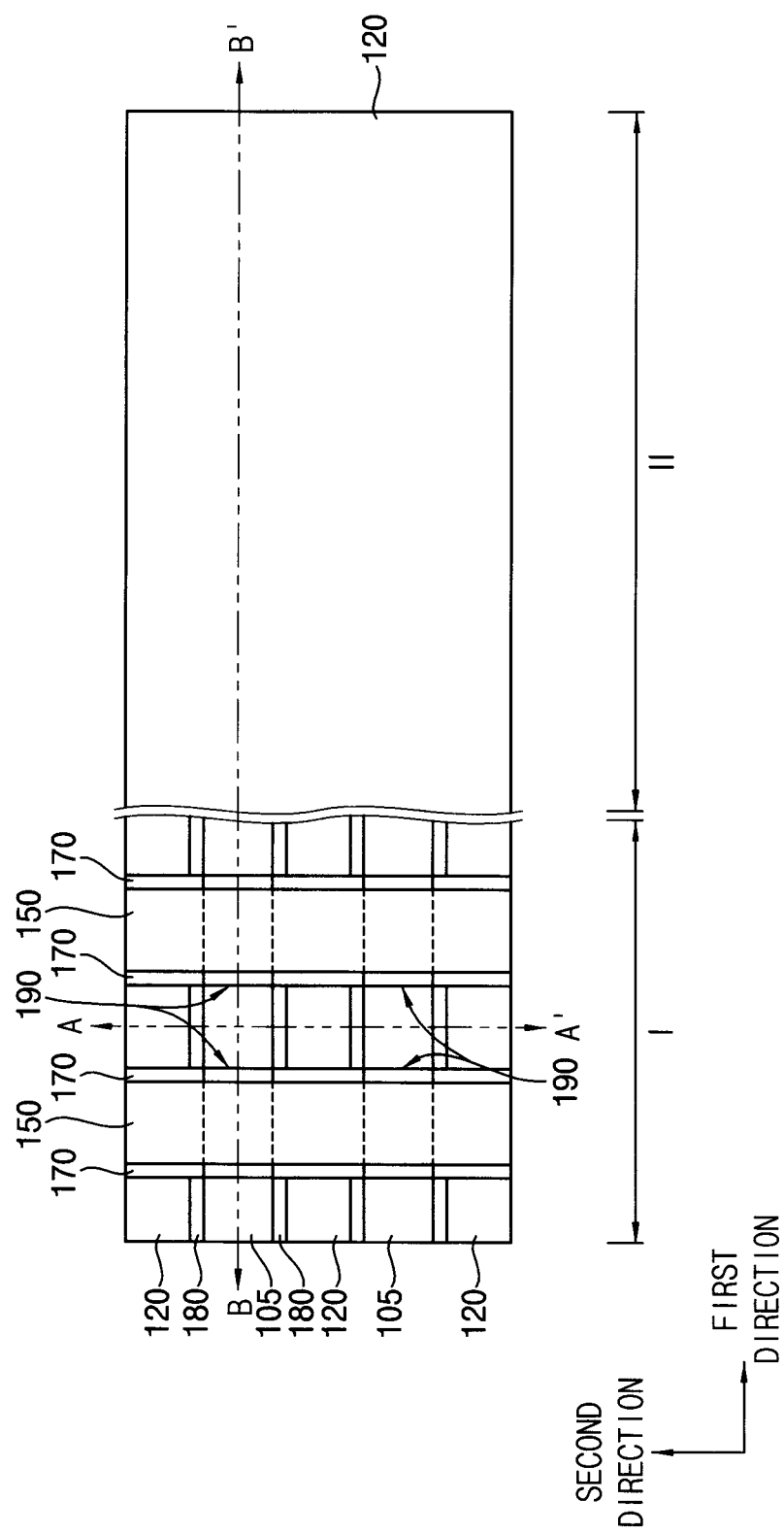
Figure 8:
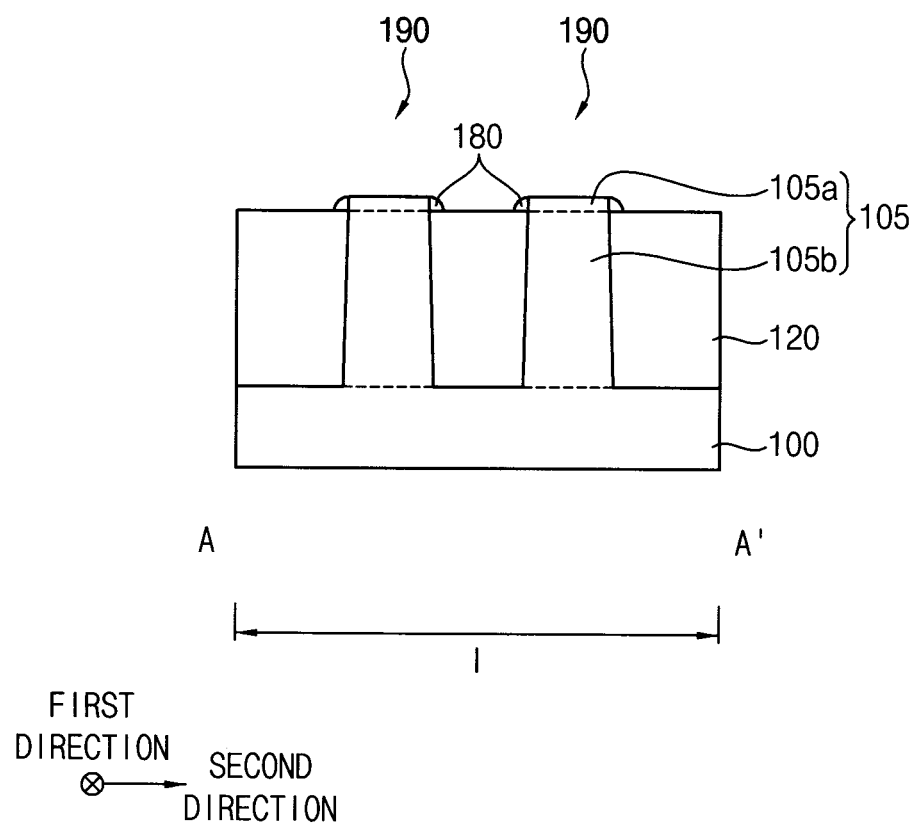
Figure 9:
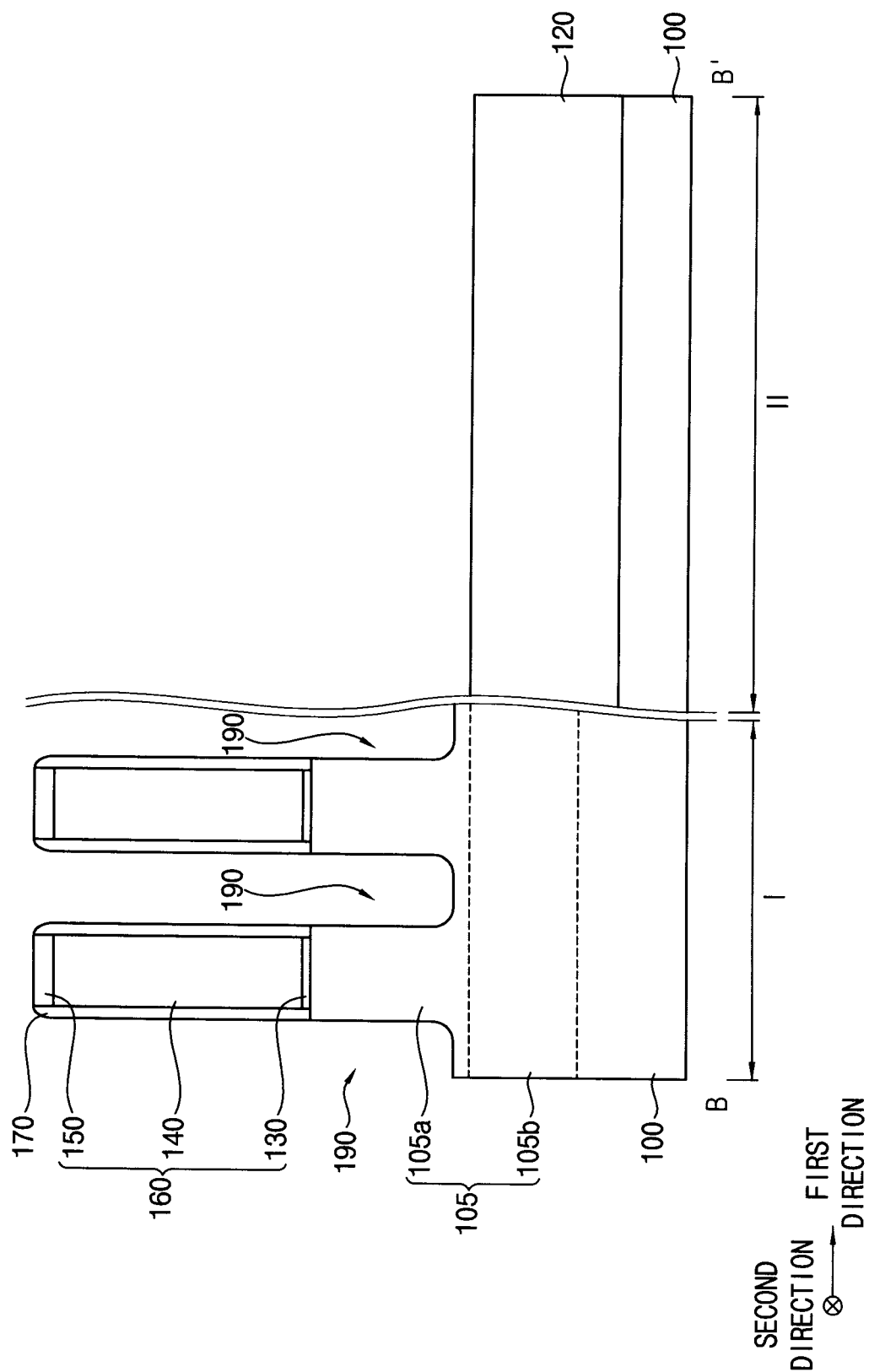

Referring to FIGS. 7 to 9, a spacer layer may be formed on the active fin 105 and the isolation pattern 120 to cover the dummy gate structure 160, and may be anisotropically etched to form a gate spacer 170 on each of opposite sidewalls of the dummy gate structure 160 in the first direction. A fin spacer 180 may be also formed on each of opposite sidewalls of the upper active pattern 105a in the second direction.

The spacer layer may include a nitride, e.g., silicon nitride. In one embodiment, the spacer layer may have a stacked structure including a nitride layer and an oxide layer.

An upper portion of the active fin 105 adjacent to the gate spacer 170 may be etched to form a second recess 190.

FIG. 9 illustrates a portion of the upper active pattern 105a of the active fin 105 is etched to form the second recess 190, so that a lower surface of the second recess 190 is higher than an upper surface of the lower active pattern 105b, but may not be limited thereto. That is, only the upper active pattern 105a may be etched to form the second recess 190, and the lower active pattern 105b is not etched to form the second recess 190, such that a depth of the second recess 190 does not penetrate the lower active pattern 105b. Alternatively both the upper active pattern 105a and also a portion of the lower active pattern 105b may be etched to form the second recess 190. Therefore, the lower surface of the second recess 190 may be lower than a height of an upper surface of the lower active pattern 105b on which no second recess 190 is formed. In other words, the depth of the second recess 190 may penetrate through the upper active pattern 105a and into the lower active pattern 105b such that a depth of the second recess 190 is provided below a top surface of the lower active pattern 105b.

When the second recess 190 is formed, the fin spacer 180 on each of the opposite sidewalls of the upper active pattern 105a may be also partially removed so that a portion of the fin spacer 180 may remain, or the fin spacer 190 may be completely removed.

In embodiments of the disclosure, the etching process for forming the second recess 190 and the etching process for forming the gate spacer 170 and the fin spacer 180 may be performed in-situ.

Figure 10:
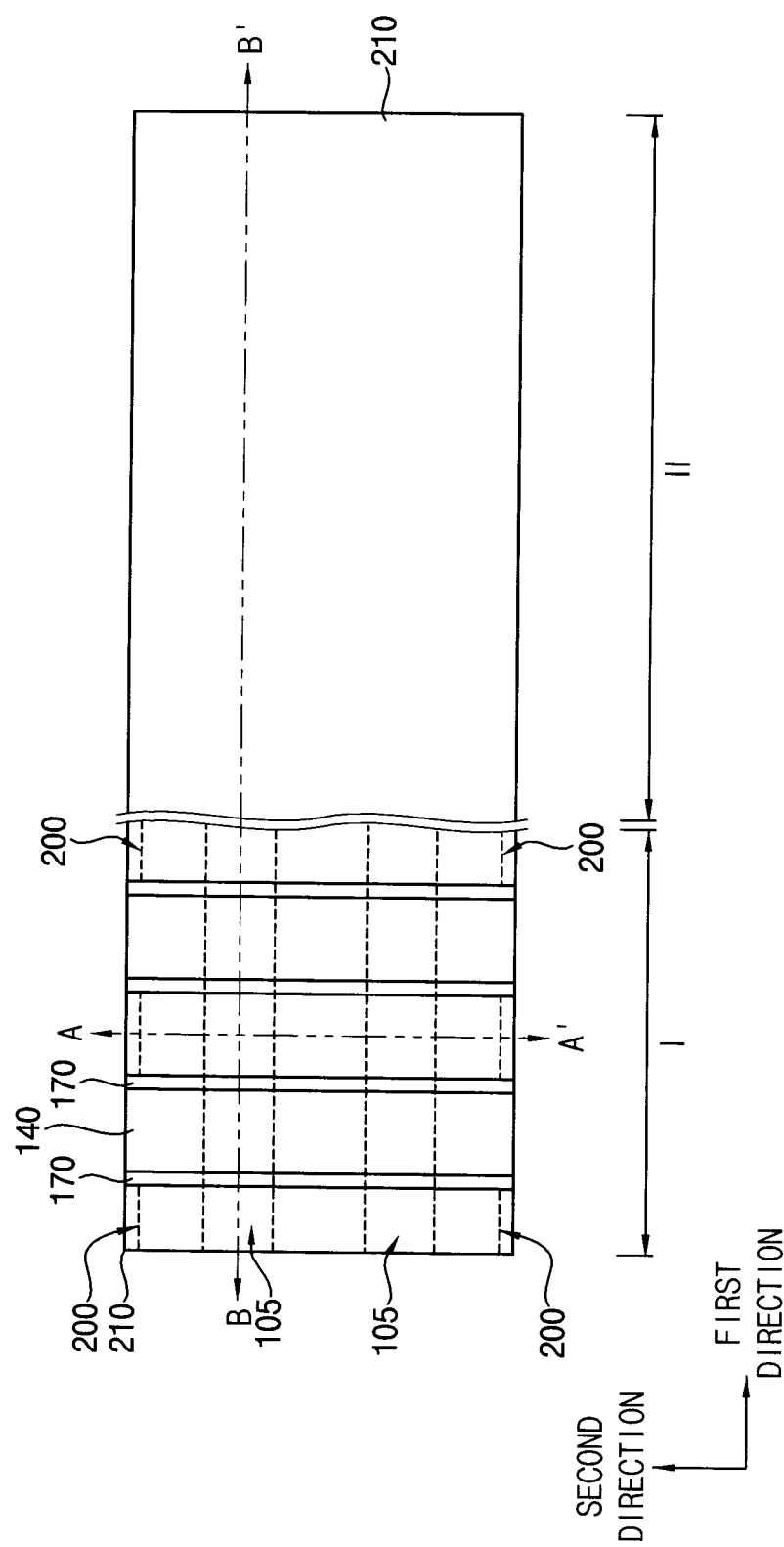
Figure 11:
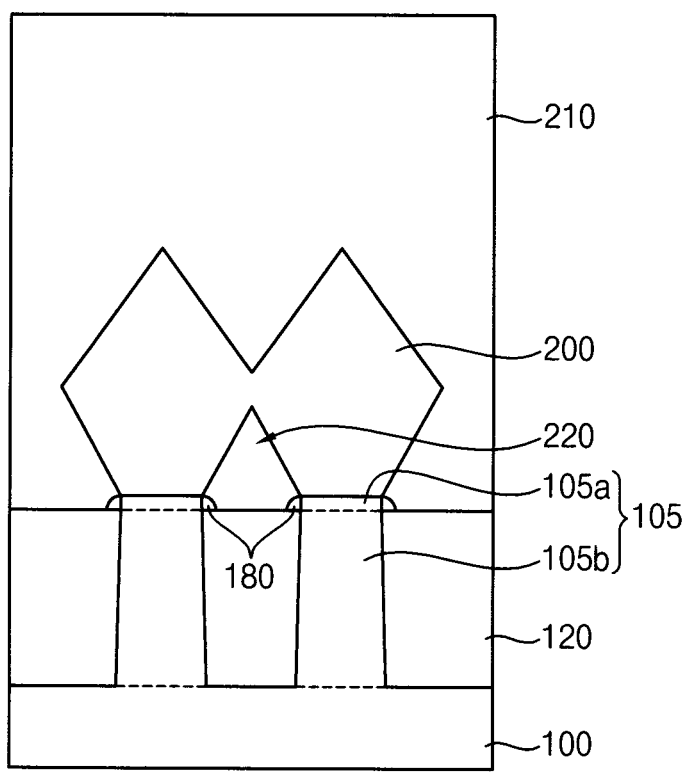
Figure 12:
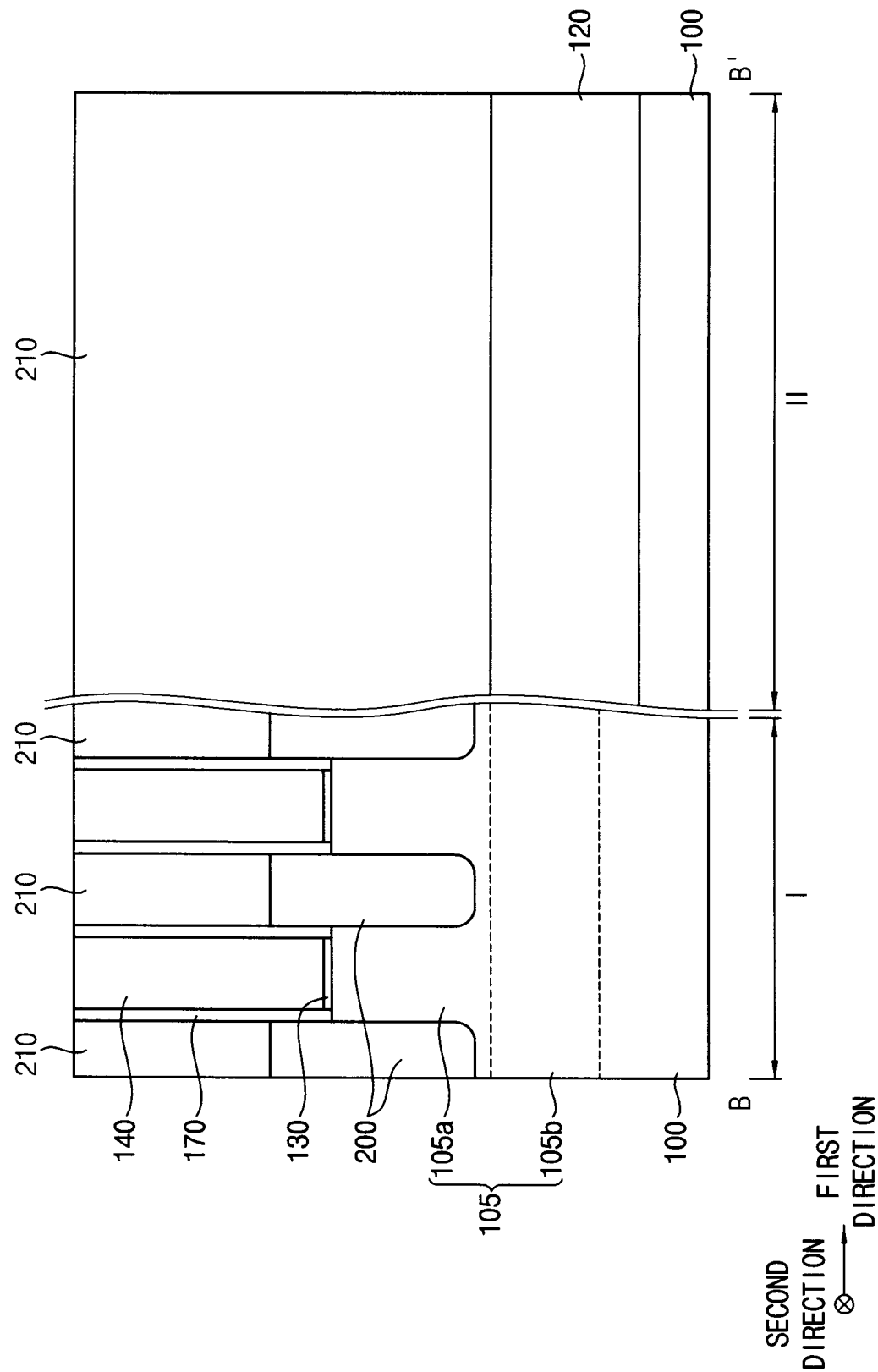

Referring to FIGS. 10 to 12, a source/drain layer 200 may be formed to fill the second recess 190.

In embodiments of the disclosure, the source/drain layer 200 may be formed by performing a selective epitaxial growth (SEG) process using the upper surface of the active fin 105 exposed by the second recess 190 as a seed.

In embodiments of the disclosure, the SEG process may be performed using a silicon source gas, a germanium source gas, an etching gas and a carrier gas, and thus a single crystalline silicon-germanium layer as the source/drain layer 200 may be formed. The SEG process may be also performed using a P-type impurity source gas, and thus a single crystalline silicon-germanium layer doped with P-type impurities as the source/drain layer 200 may be formed.

Alternatively, the SEG process may be performed using a silicon source gas, a carbon source gas, an etching gas and a carrier gas, and thus a single crystalline silicon-carbide layer as the source/drain layer 200 may be formed. The SEG process may be also performed using an N-type impurity source gas, and thus a single crystalline silicon-carbide layer doped with N-type impurities as the source/drain layer 200 may be formed. In some embodiments, the SEG process may be performed using a silicon source gas, an etching gas and a carrier gas, and thus a single crystalline silicon layer as the source/drain layer 200 may be formed. The SEG process may be also performed using an N-type impurity source gas, and thus a single crystalline silicon layer doped with N-type impurities as the source/drain layer 200 may be formed.

The source/drain layer 200 may be grown both in a vertical direction and also in a horizontal direction to fill the second recess 190, and an upper portion of the source/drain layer 200 may contact a sidewall of the gate spacer 170. In embodiments of the disclosure, the source/drain layer 200 may have a shape of which a cross-section taken along the second direction may be similar to a pentagon.

In embodiments of the disclosure, when neighboring active fins 105 disposed in the second direction are close to each other, the source/drain layers 200 growing on the neighboring active fins 105, respectively, may be merged with each other. FIG. 11 shows that two source/drain layers 200 grown on neighboring two active fins 105, respectively, which are merged to contact with each other, but may not be limited thereto. Thus, for example, more than two source/drain layers 200 may be merged with each other.

After forming a first insulating interlayer 210 covering the dummy gate structure 160, the gate spacer 170, the fin spacer 180 and the source/drain layer 200 to a sufficient height on the active fin 105 and the isolation pattern 120, the first insulating interlayer 210 may be planarized until an upper surface of the dummy gate electrode 140 may be exposed. During the planarization process, the dummy gate mask 150 may be also removed together with the first insulating interlayer 210.

A space between the merged source/drain layers 200 and the isolation pattern 120 may not be completely filled with the first insulating interlayer 210, and thus gap or void 220 may be formed therein. Air may be disposed in the gap 220.

The first insulating interlayer 210 may include a silicon oxide, e.g., tonen silazene (TOSZ). Alternatively, the first insulating interlayer 210 may include a low dielectric material having a dielectric constant less than a dielectric constant of silicon oxide, for example, a dielectric constant of about 3.9. That is, the first insulating interlayer 210 may include an inorganic polymer, e.g., silicon oxide doped with fluorine or carbon, porous silicon oxide, spin-on organic polymer, hydrogen silsesquioxane (HSSQ), methyl silsesquioxane (MSSQ), etc. The first insulating interlayer 210 may have a structure in which a first layer including silicon oxide and a second layer including a low-k material are sequentially stacked. The planarization process may be performed by a CMP process and/or an etch back process.

Figure 13:
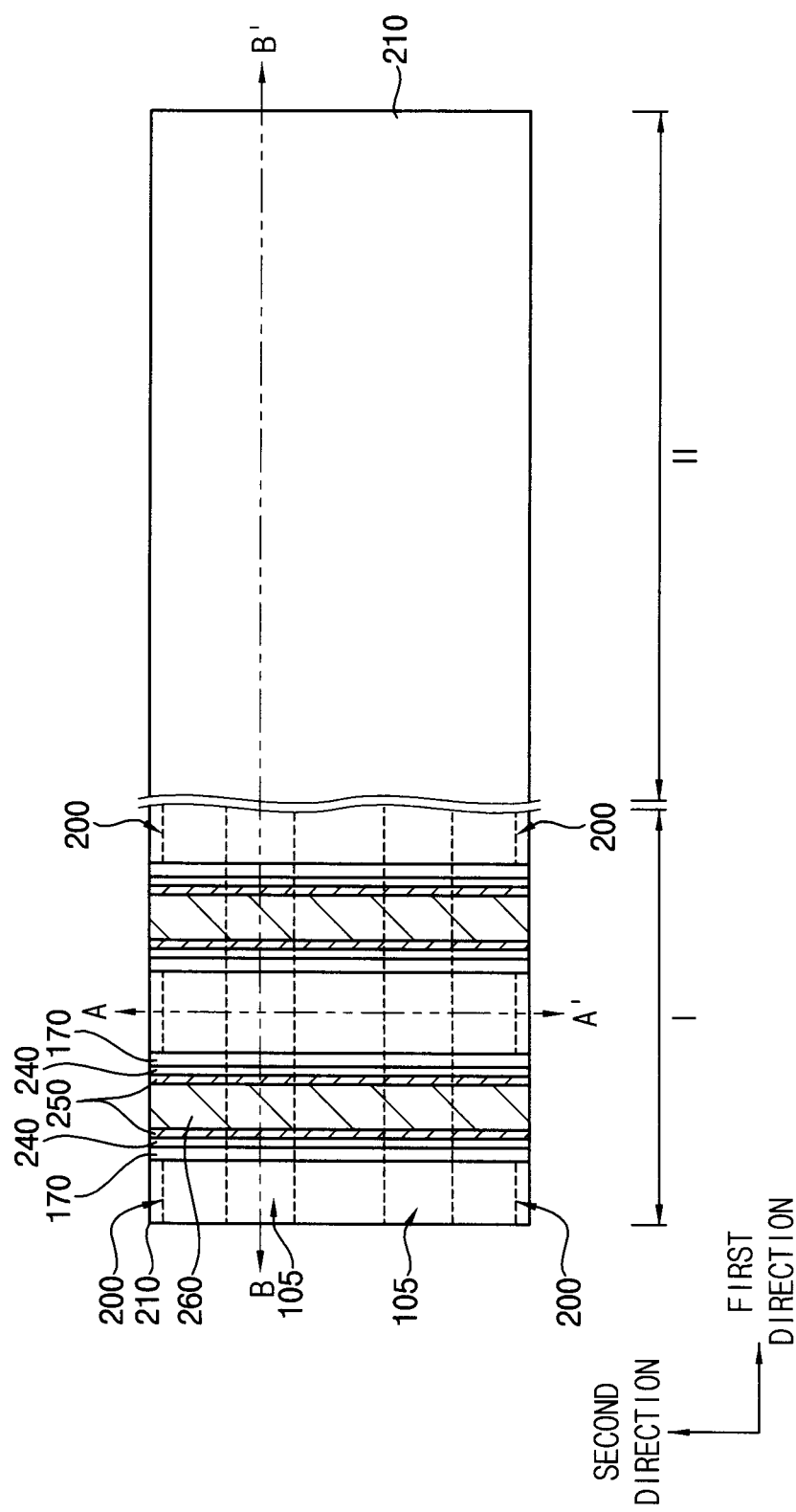
Figure 14:
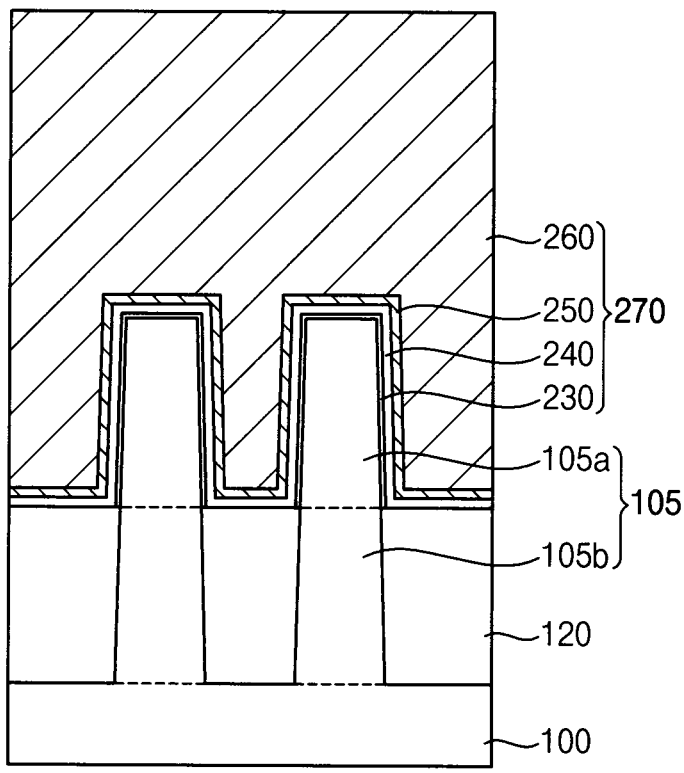
Figure 15:
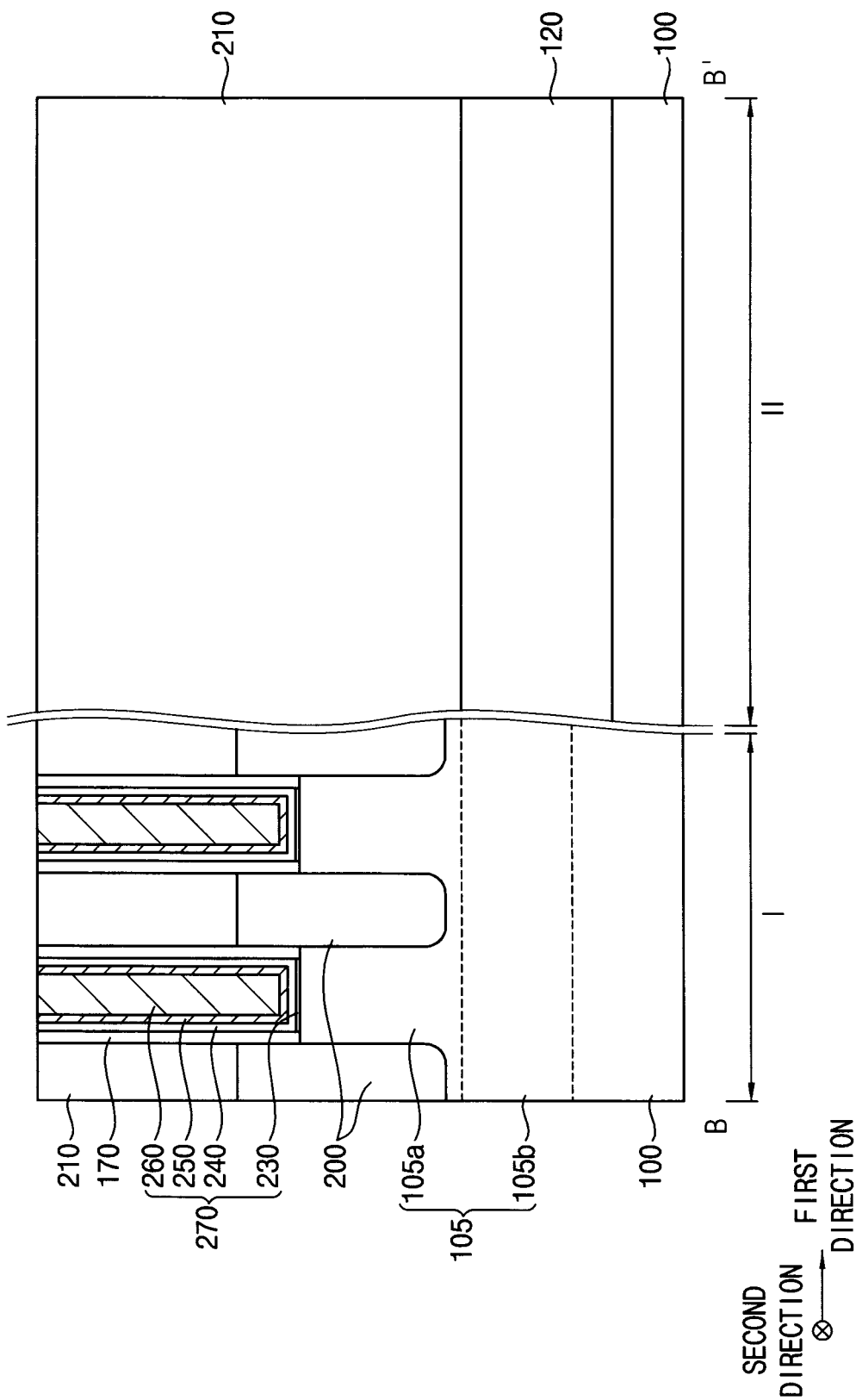

Referring to FIGS. 13 to 15, the exposed dummy gate electrode 140 and the dummy gate insulation pattern 130 thereunder may be removed to form a first opening exposing an inner sidewall of the gate spacer 170 and the upper surface of the active fin 105, and a gate electrode structure 270 may be formed to fill the first opening.

In embodiments of the disclosure, the dummy gate electrode 140 and the dummy gate insulation pattern 130 thereunder may be removed by a dry etching process and a wet etching process, and the wet etching process may be performed using, e.g., hydrogen fluoride (HF).

After performing a thermal oxidation process on the upper surface of the active fin 105 exposed by the first opening to form an interface pattern 230, a gate insulation layer and a work function control layer may be sequentially formed on the interface pattern 230, the isolation pattern 120, the gate spacer 170 and the first insulating interlayer 210, and a gate electrode layer may be formed on the work function control layer to fill a remaining portion of the first opening.

The work function control layer and the gate electrode layer may be formed by, e.g., a CVD process, an ALD process, a physical vapor deposition (PVD) process, etc. A heat treatment process, e.g., a rapid thermal annealing (RTA) process, a spike-RTA process, a flash-RTA process or a laser annealing process, etc., may be further performed on the gate electrode layer.

Similar to the gate insulation layer or the gate electrode layer, the interface pattern 230 may be formed by a CVD process or an ALD process instead of a thermal oxidation process. In this case, the interface pattern 230 may be formed on the upper surface of the active fin 105 and also an upper surface of the isolation pattern 120 and the inner sidewall of the gate spacer 170 on the first region I of the substrate 100. Alternatively, the interface pattern 230 may not be formed.

The gate electrode layer, the work function layer and the gate insulation layer may be planarized until an upper surface of the first insulating interlayer 210 may be exposed to form a gate insulation pattern 240 and a work function control pattern 250 sequentially stacked on an upper surface of the interface pattern 230, the upper surface of the isolation pattern 120 and the inner sidewall of the gate spacer 170, and a gate electrode 260 filling a remaining portion of the first opening may be formed on the work function control pattern 250.

The interface pattern 230, the gate insulation pattern 240, the work function control pattern 250 and the gate electrode 260 sequentially stacked may form the gate electrode structure 270, and may form a transistor together with the source/drain layer 200. The transistor may form a PMOS transistor or an NMOS transistor according to the conductivity type of the source/drain layers 200.

Figure 16:
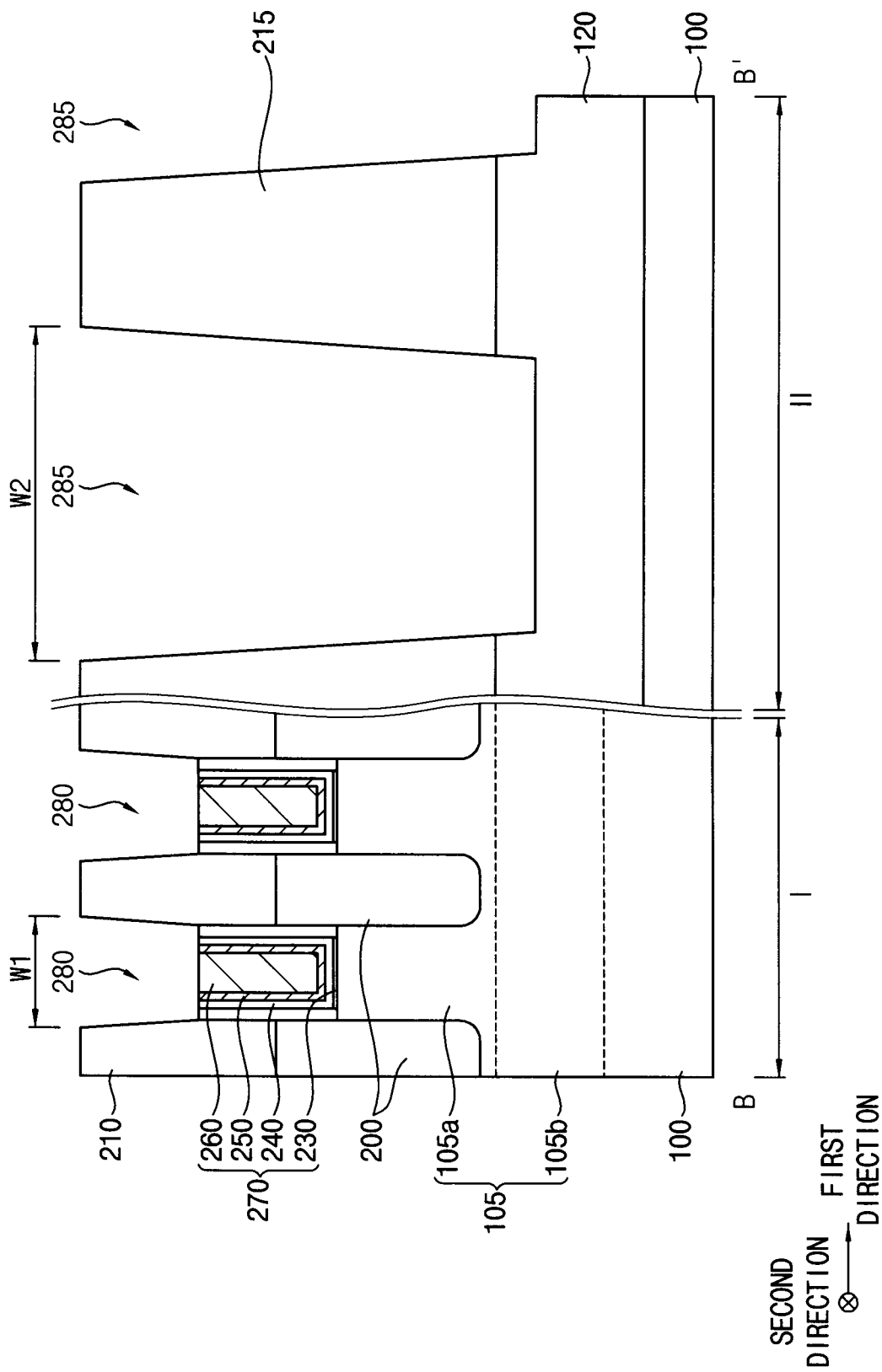

Referring to FIG. 16, upper portions of the gate electrode structure 270 and the gate spacer 170 may be removed to form a third recess 280, and the isolation pattern 120 on the second region II of the substrate 100 may be partially removed to form a second opening 285 exposing the upper surface of the isolation pattern 120. Alternatively, the isolation pattern 120 on the second region II of the substrate 100 may be removed to form a second opening 285 exposing the upper surface of the substrate 100, and this case will be described later with reference to FIG. 23.

Accordingly, an alignment key 215 may be formed on the second region II of the substrate 100, that is, on a portion of the isolation pattern not removed when forming the second opening 285.

In embodiments of the disclosure, the third recess 280 and the second opening 285 may be simultaneously formed by the same etching process, e.g., a dry etching process. Alternatively, the third recess 280 and the second opening 285 may be sequentially formed by different etching processes.

In embodiments of the disclosure, a first width W1 of the third recess 280 between top surfaces of the fins 105 or the first insulating layer 210 and a fin 105 may be smaller than a second width W2 of the second opening 285 between a top surface of the alignment key 215 and a top surface of a fin 215.

Figure 17:
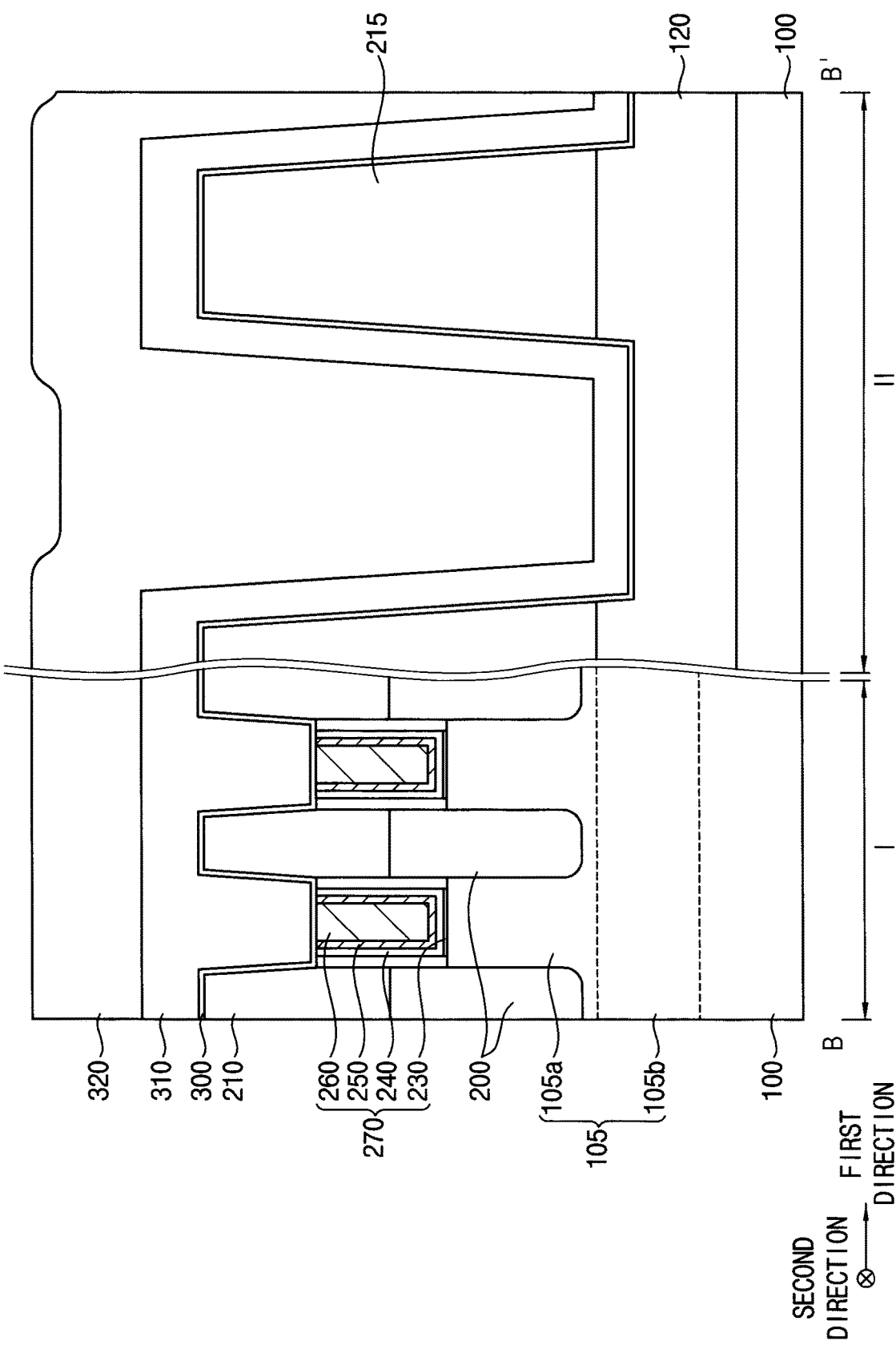

Referring to FIG. 17, an etch stop layer 300 may be formed on lower surfaces and sidewalls of the third recess 280 and the second opening 285 and upper surfaces of the first insulating interlayer 210 and the alignment key 215, and a first insulation layer 310 and a second insulation layer 320 may be sequentially stacked on the etch stop layer 300.

In embodiments of the disclosure, the etch stop layer 300 may be conformally formed on the lower surfaces and the sidewalls of the third recess 280 and the second opening 285, the first insulation layer 310 may be formed to fill the third recess 280, but to partially fill the second openings 285 on the lower surfaces and sidewalls of the third recess 280 and the second opening 285, and the second insulation layer 320 may fill a remaining portion of the second opening 285.

The first insulation layer 310 may include a material having a high insulating property and a low etching rate, e.g., silicon oxycarbide (SiOC). Silicon oxycarbide (SiOC) is highly hydrophobic, and thus may not be polished well in a subsequent polishing process. The first insulation layer 310 including silicon oxycarbide (SiOC) is not formed to have a great thickness, and thus the first insulation layer 310 may not fill an entire portion of the second opening 285, but partially fill the second opening 285 having a relatively great width.

The etch stop layer 300 may include a material having a high etching selectivity with respect to the first insulation layer 310, e.g., a nitride such as silicon nitride (SiN), silicon oxynitride (SiON), silicon carbonitride (SiCN), etc. The second insulation layer 320 may include a material having good gap fill characteristics. e.g., an oxide such as tetra ethyl ortho silicate (TEOS).

Figure 18:
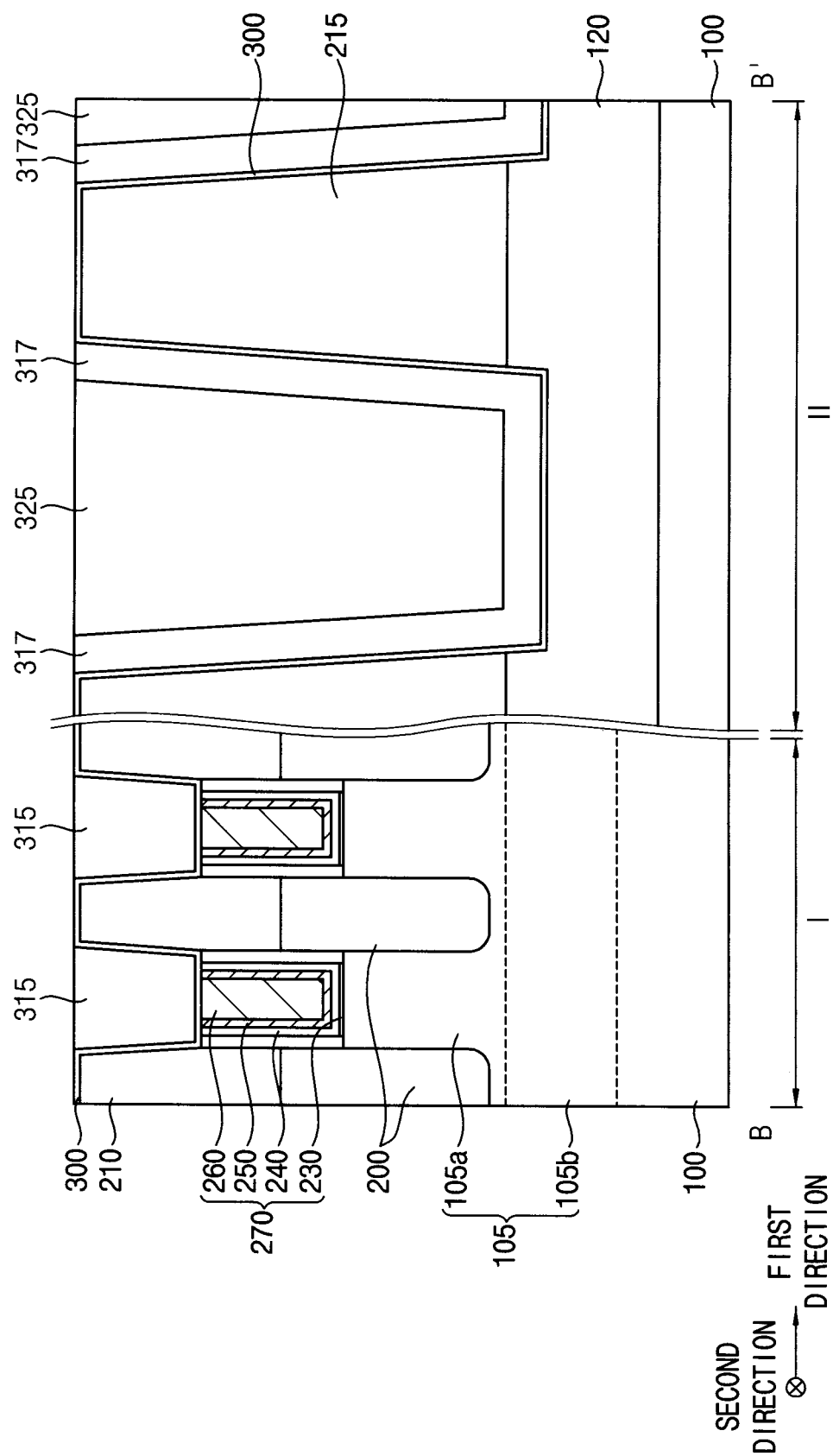

Referring to FIG. 18, the second insulation layer 320 and the first insulation layer 310 may be planarized. Accordingly, a capping pattern 315 may be formed in the third recess 280, and a first filling pattern 325 and a second filling pattern 317 covering a lower surface and a sidewall of the first filling pattern 325 may be formed in the second opening 285.

In embodiments of the disclosure, the planarization process may include a CMP process, and the CMP process may be performed until an uppermost surface of the etch stop layer 300 may be exposed. The CMP process may be performed by using portions of the etch stop layer 300 on the upper surfaces of the first insulating interlayer 210 and the alignment key 215 as a polishing end point, and thus the alignment key 215 may not be removed by the CMP process and an original height of the alignment key 215 may be maintained.

In the CMP process, the second opening 285 surrounding the alignment key 215 may be filled with the etch stop layer 300 and the first and second insulation layers 310 and 320, and thus a relatively high pressure may not be applied to the second opening 285 when compared to the first region I of the substrate 100. Accordingly, the planarization process may be uniformly performed.

A slurry used in the CMP process may include an abrasive, e.g., $SiO_x$, $Al_xO_y$, $Ce_xO_y$, etc., and the slurry may have a PH value, e.g., in a range of about 2 to about 10.

Figure 19:
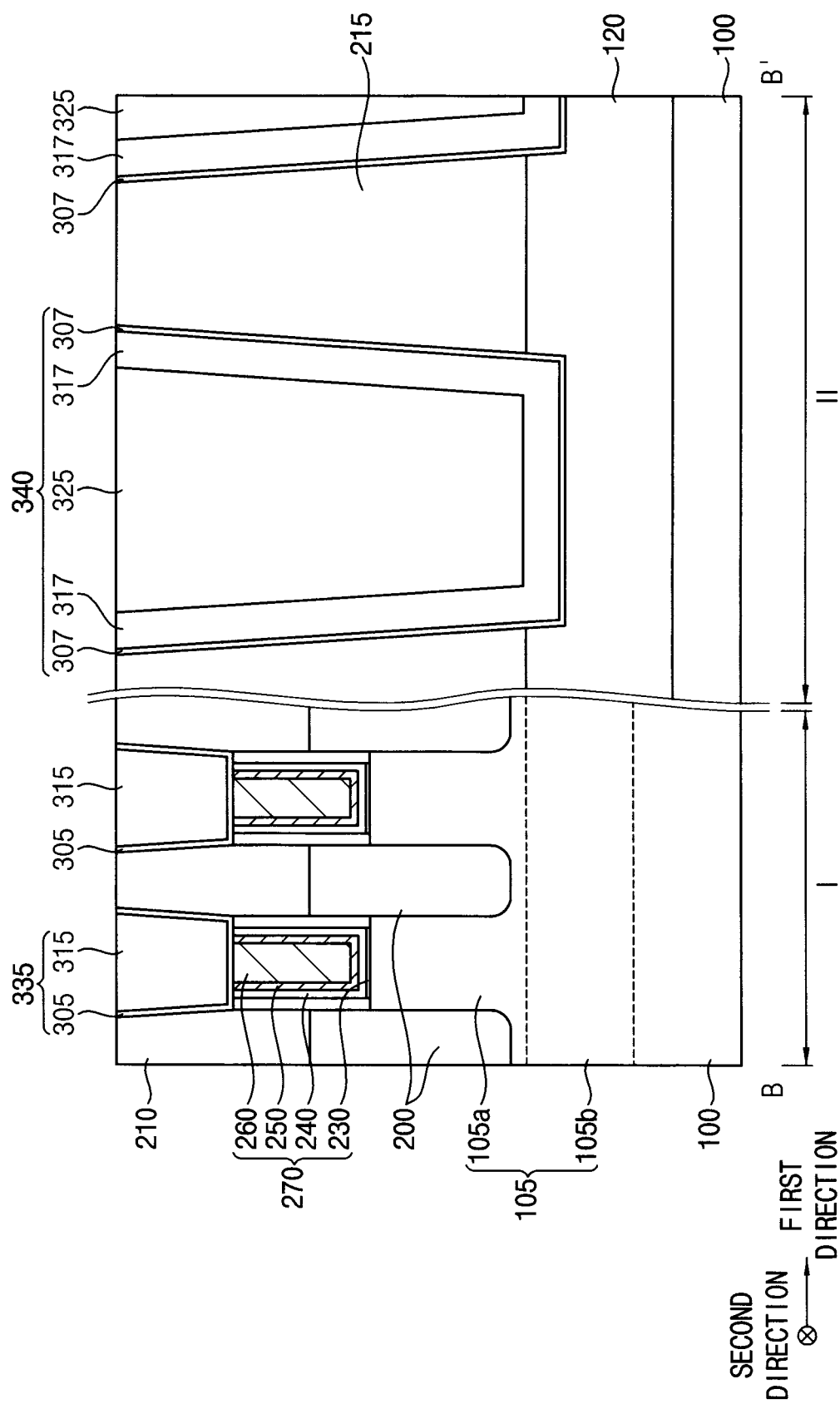

Referring to FIG. 19, the exposed portions of the etch stop layer 300 may be removed to form a first etch stop pattern 305 in the third recess 280 and a second etch stop pattern 307 in the second opening 285.

The exposed portions of the etch stop layer 300 may be removed by, e.g., a wet etching process or a CMP process. The etch stop layer 300 may include, e.g., a nitride, and may have a high etching selectivity with respect to the alignment key 215 including, e.g., an oxide. Accordingly, the alignment key 215 may not be removed in the removal process of the exposed portions of the etch stop layer 300, and the original height of the alignment key 215 may be maintained.

The first etch stop pattern 305 may be conformally formed on the lower surface and the sidewall of the third recess 280 exposing upper surfaces of the gate electrode structure 270 and the gate spacer 170 on the first region I of the substrate 100, and the capping pattern 315 may be formed on the first etch stop pattern 305 to fill a remaining portion of the third recess 280. The first etch stop pattern 305 and the capping pattern 315 together may form a capping structure 335. The gate electrode structure 270, the gate spacer 170 and the capping structure 335 together may form a gate structure.

The second etch stop pattern 307 may be conformally formed on the lower surface and the sidewall of the second opening 285 surrounding the alignment key 215 on the second region II of the substrate 100 and exposing the upper surface of the substrate 100, the second filling pattern 317 may be formed on the second etch stop pattern 307, and the first filling pattern 325 filling a remaining portion of the second opening 285 may be formed on the second filling pattern 317. The second etch stop pattern 307, the first and second filling patterns 325 and 317 may form a filling structure 340. Here, the terms "first" and "second" are merely to distinguish one element from another. For example, the second etch stop pattern 307 may be referred to as a first etch stop pattern, and the first etch stop pattern 305 may be referred to as a second etch stop pattern. Similarly, the first filling pattern 325 may be referred to as a first filling pattern and the second filling pattern 317 may be referred to as a first filling pattern.

Unlike the processes illustrated in FIGS. 18 and 19, the second insulation layer 320 may be planarized until an upper surface of the first insulation layer 310 may be exposed, and upper portions of the first insulation layer 310 and the etch stop layer 300 may be removed.

Figure 20:
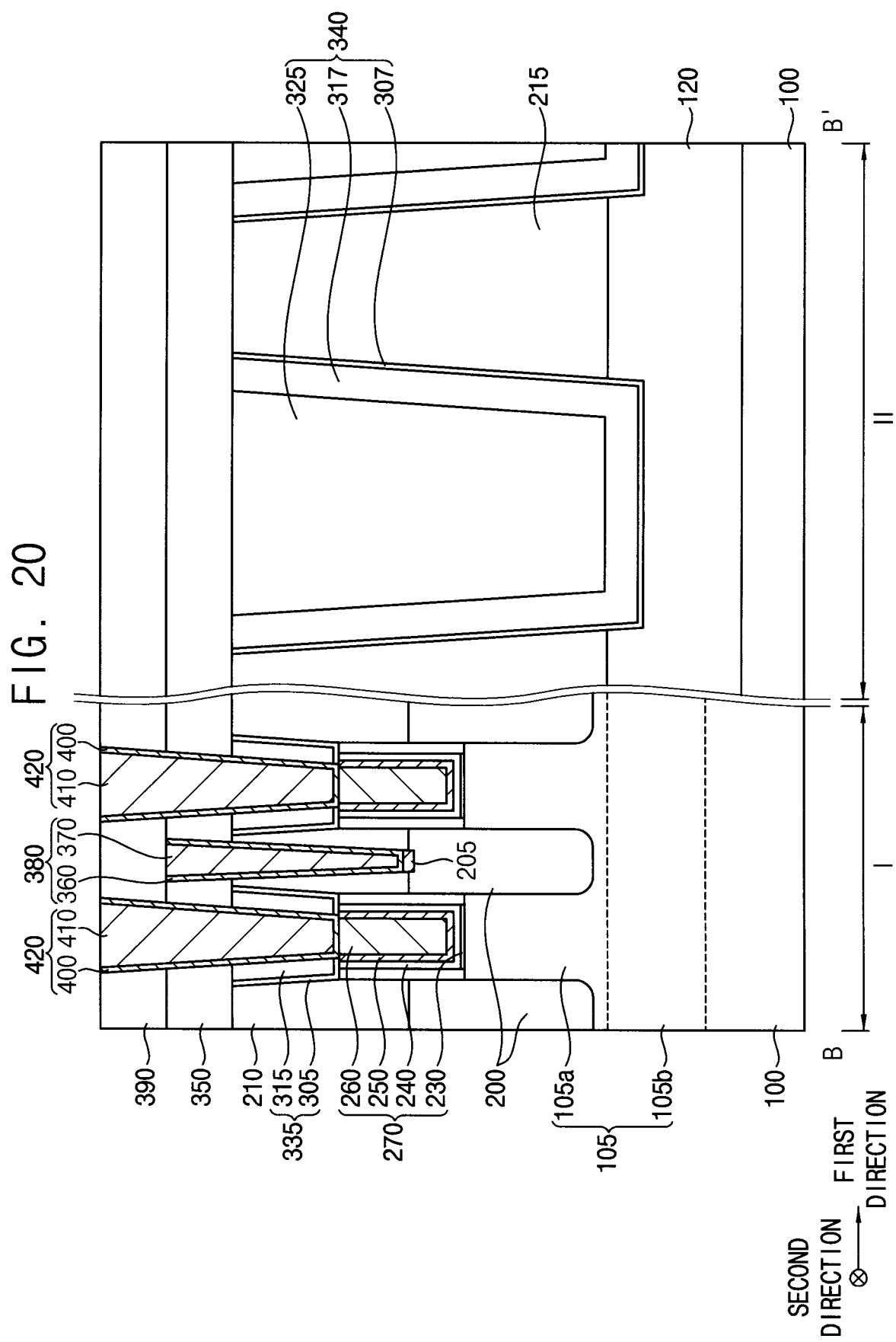

Referring to FIG. 20, after forming a second insulation interlayer 350 on the capping structure 335, the first insulating interlayer 210, the alignment key 215 and the filling structure 340, a first contact plug 380 may be formed through the second insulating interlayer 350 and the first insulating interlayer 210 to contact an upper surface of the source/drain layer 200.

After forming a third insulating interlayer 390 on the first contact plug 380 and the second insulating interlayer 350, a second contact plug 420 may be formed through the third insulating interlayer 390, the second insulating interlayer 350 and the capping structure 335 to contact an upper surface of the gate electrode structure 270.

Specifically, a third opening may be formed through the second insulating interlayer 350 and the first insulating interlayer 210 to expose the upper surface of the source/drain layer 200, a first metal layer may be formed on the exposed source/drain layer 200, a sidewall of the third opening and an upper surface of the second insulating interlayer 350, and a heat treatment process may be performed to form a metal silicide pattern 205 on the exposed source/drain layer 200. The first metal layer may include, e.g., nickel, cobalt, titanium, etc., and thus the metal silicide pattern 205 may include, e.g., nickel silicide, cobalt silicide, titanium silicide, etc.

After removing unreacted portions of the first metal layer, a first barrier layer may be formed on an upper surface of the metal silicide pattern 205, the sidewall of the third opening and the upper surface of the second insulating interlayer 350, a second metal layer may be formed on the first barrier layer to fill a remaining portion of the third opening, and the second metal layer and the first barrier layer may be planarized until the upper surface of the second insulating interlayer 350 may be exposed. Accordingly, a first barrier pattern 360 may be formed on the upper surface of the metal silicide pattern 205 and the sidewall of the third opening, a second metal pattern 370 filling the remaining portion of the third opening may be formed. The first barrier pattern 360 and the second metal pattern 370 together may form the first contact plug 380.

After forming a fourth opening through the third insulating interlayer 390, the second insulating interlayer 350 and the capping structure 335 to expose the upper surface of the gate electrode structure 270, a second barrier layer may be formed on the upper surface of the gate electrode structure 270, a sidewall of the fourth opening and an upper surface of the third insulating interlayer 390, a third metal layer may be formed on the second barrier layer to fill a remaining portion of the fourth opening, and the third metal layer and the second barrier layer may be planarized until the upper surface of the third insulating interlayer 390 may be exposed. Accordingly, a second barrier pattern 400 may be formed on the upper surface of the gate electrode structure 270 and the sidewall of the fourth opening, and a third metal pattern 410 filling the remaining portion of the fourth opening may be formed on the second barrier pattern 400. The second barrier pattern 400 and the third metal pattern 410 together may form the second contact plug 420.

The first and second barrier patterns 360 and 400 may include a metal nitride, e.g., tantalum nitride, titanium nitride, etc., and the second and third metal patterns 370 and 410 may include a metal, e.g., tungsten, copper, aluminum, etc.

By the processes described above, the fabrication of the semiconductor device may be completed.

As described above, a width of the second opening 285 for forming the alignment key 215 may be greater than that of the third recess 280 for forming the capping pattern 315, which may cover the gate electrode structure 270, and thus the capping pattern 315 formed by planarizing the first insulation layer 310 may entirely fill the third recess 280, and, the second filling pattern 317 also formed by planarizing the first insulation layer 310 may not entirely fill the second opening 285. However, in embodiments of the disclosure, the second insulation layer 320 filling the remaining portion of the second opening 285 may be further formed on the first insulation layer 310 so that the alignment key 215 may not be rapidly polished due to the concentration of pressure on the alignment key 215 in the CMP process.

Also, the etch stop layer 300 having a high first etching selectivity with respect to the first insulation layer 310 may be formed on the third recess 280 and the second opening 285 so that the alignment key 215 having a second etching selectivity lower than the first etching selectivity with respect to the first insulation layer 310 may not be polished to be removed in the CMP process.

The embodiments herein may be applied to not only the gate electrode structure 270, but also any other types of conductive structures having the capping structure 355 thereon.

The semiconductor device may include the gate electrode structure 270 formed on the first region I of the substrate 100 including the first and second regions I and II, the capping structure 335 covering the upper surface of the gate electrode structure 270, the alignment key 215 formed on the second region II of the substrate 100 and including an insulating material, and the filling structure 340 formed on the second region II of the substrate 100 and covering a sidewall of the alignment key 215. The capping structure 335 may include the capping pattern 315 and the first etch stop pattern 305 covering a lower surface and a sidewall of the capping pattern 315, and the filling structure 340 may include the first filling pattern 325, the second filling pattern 317 covering the lower surface and the sidewall of the first filling pattern 325, and the second etch stop pattern 307 covering a lower surface and a sidewall of the second filling pattern 317.

In embodiments of the disclosure, the capping pattern 315 and the second filling pattern 317 may include the same material, e.g., silicon oxycarbide (SiOC), and the first and second etch stop patterns 305 and 307 may include a material having the first etching selectivity with respect to the capping pattern 315, e.g., silicon nitride (SiN), silicon oxynitride (SiON) or silicon carbonitride (SiCN).

In embodiments of the disclosure, the alignment key 215 may include a material having the second etching selectivity lower than the first etching selectivity with respect to the first insulation layer 310. e.g., an oxide, and the first filling pattern 325 may also include, e.g., an oxide.

In embodiments of the disclosure, the width of the filling structure 340 may be greater than that of the capping structure 335, and a lower surface of the filling structure 340 may be lower than a lower surface of the alignment key 215.

FIGS. 21 to 25 are plan views illustrating stages of a method of manufacturing a semiconductor device in accordance with embodiments of the disclosure. This method of manufacturing the semiconductor device includes processes substantially the same as or similar to the processes included in the method illustrated in FIGS. 1 to 20, and thus redundant descriptions thereon are omitted herein.

This semiconductor device may be a DRAM device, and a method of forming a gate structure of the DRAM device will be described below.

Figure 21:
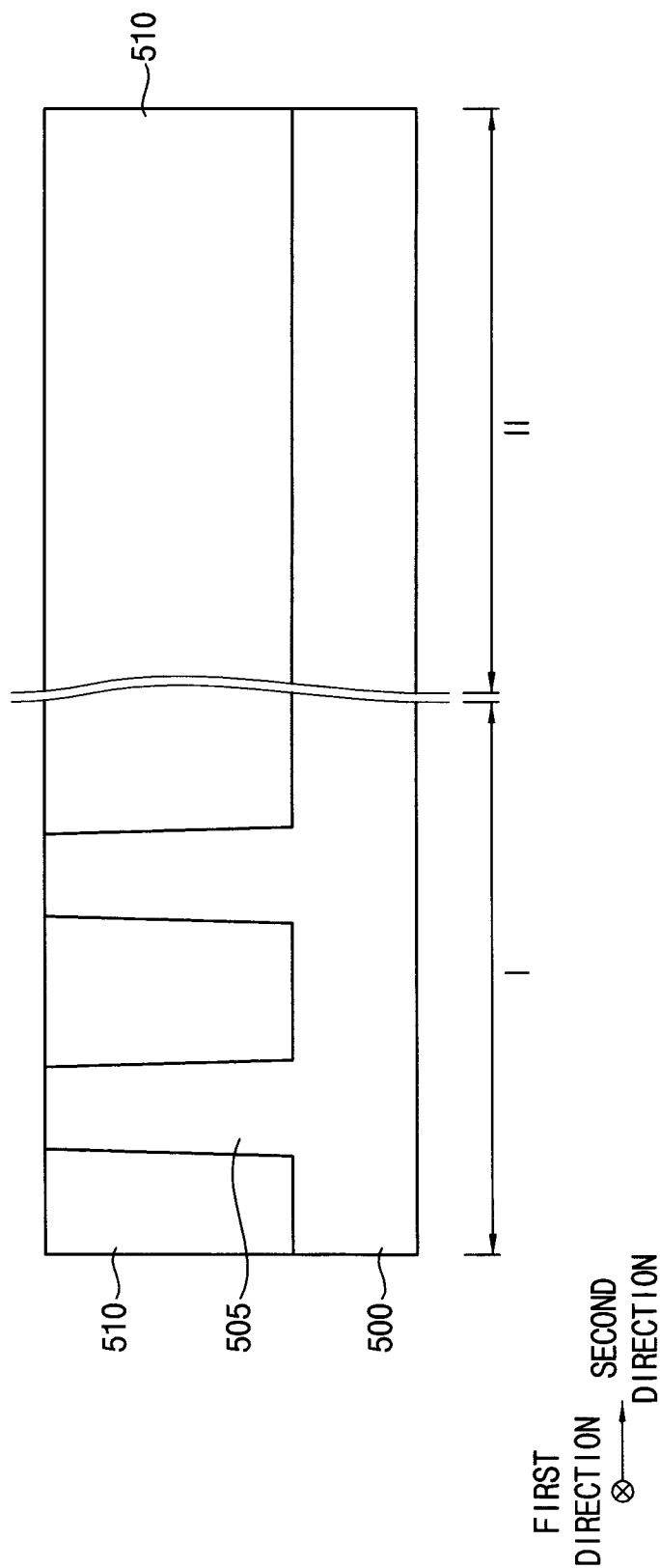
FIGS. 21, 22, 23, 24, and 25 are plan views illustrating stages of a method of manufacturing a semiconductor device in accordance with embodiments of the disclosure.

Referring to FIG. 21, an upper portion of the substrate 500 including first and second regions I and II may be etched to form a trench, and an isolation pattern 510 may be formed to fill the trench.

Accordingly, an active region 505 of which a sidewall may be surrounded by the isolation pattern 510 may be formed on the substrate 500.

In embodiments of the disclosure, the first region I of the substrate 500 may be a chip region on which devices are formed, and the second region II of the substrate 500 may be a scribe lane region surrounding the chip region. Alternatively, each of the first and second regions I and II of the substrate 500 may be a portion of a chip region on which devices are formed.

Figure 22:
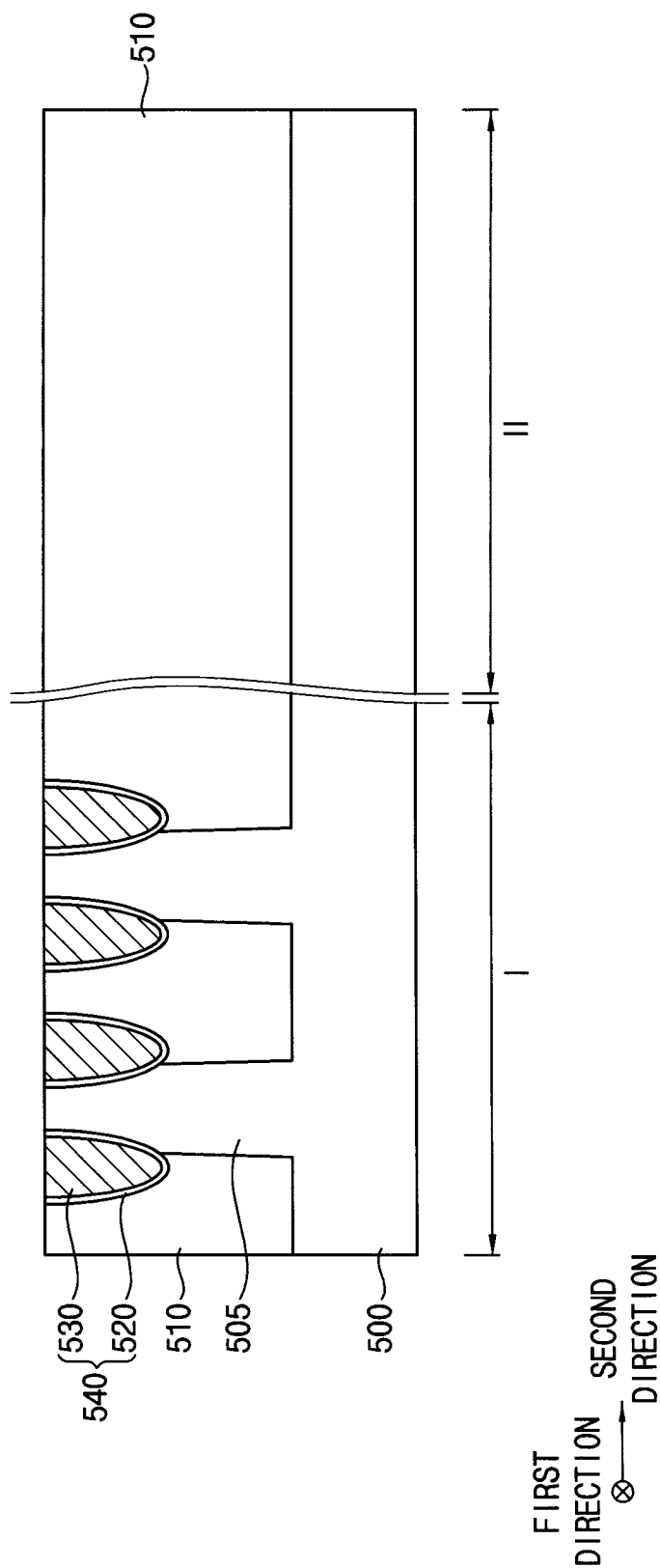

Referring to FIG. 22, a gate electrode structure 540 may be formed through upper portions of the active region 505 and the isolation pattern 510.

The gate electrode structure 540 may be formed by forming a fourth recess extending through the upper portions of the active region 505 and the isolation pattern 510, by forming a gate insulation layer on an inner sidewall of the fourth recess, an upper surface of the active region 505 and an upper surface of the isolation pattern 510, by forming a gate electrode layer on the gate insulation layer to fill the fourth recess, and by planarizing the gate electrode layer and the gate insulation layer until upper surfaces of the active region 505 and the isolation pattern 510 may be exposed.

Accordingly, the gate electrode structure 540 including a gate insulation pattern 520 and a gate electrode 530 sequentially stacked may be formed in the fourth recess.

In embodiments of the disclosure, the gate electrode structure 540 may extend in the first direction, and a plurality of gate electrode structures 540 may be formed in the second direction intersecting with the first direction.

Figure 23:
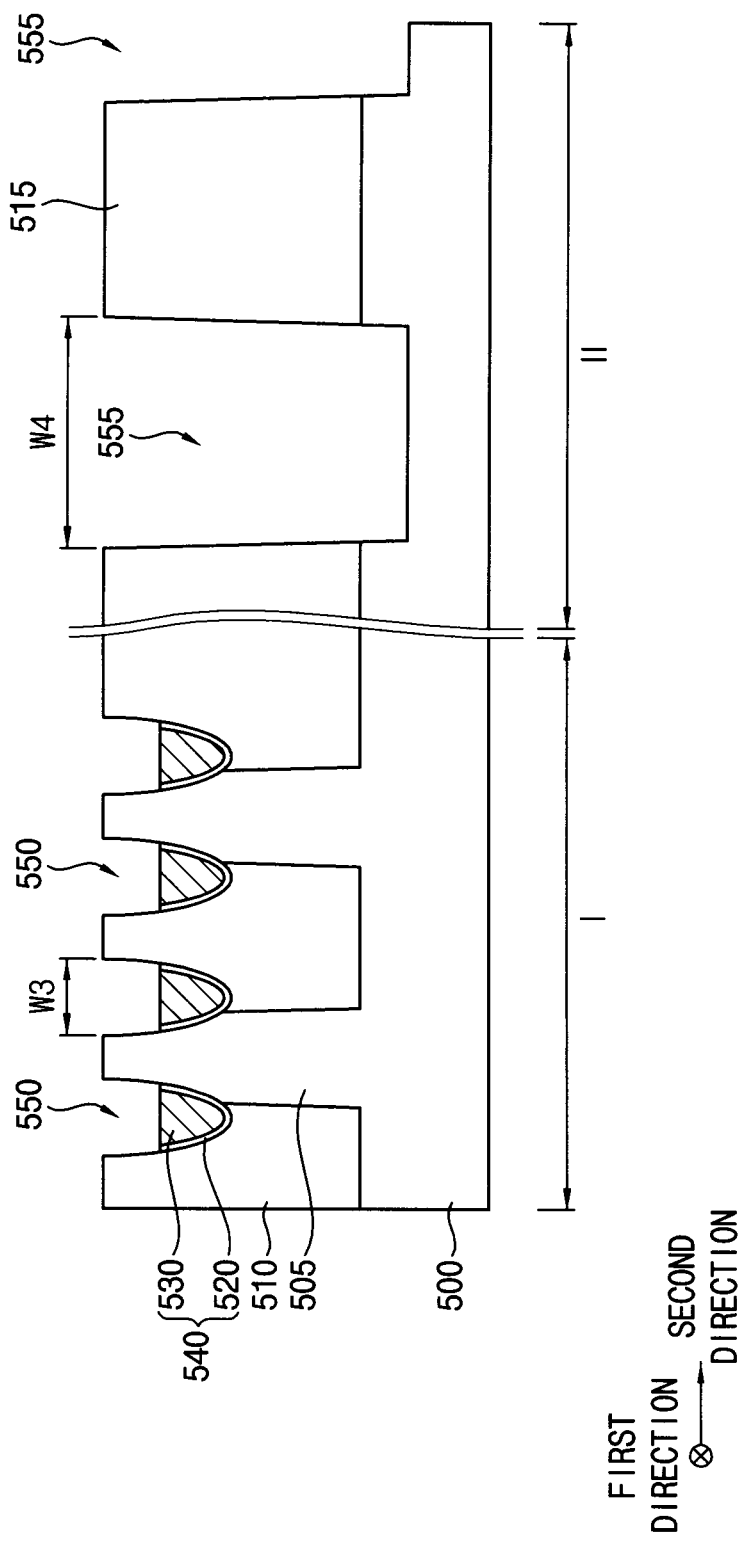

Referring to FIG. 23, an upper portion of the gate electrode structure 540 may be removed to form a fifth recess 550, and the isolation pattern 510 on the second region II of the substrate 500 may be partially removed to form a fifth opening 555 exposing an upper surface of the substrate 500.

Accordingly, an alignment key 515 may be formed on the second region II of the substrate 500.

In embodiments of the disclosure, the fifth recess 550 and the fifth opening 555 may be simultaneously formed by the same etching process, e.g., a dry etching process. Alternatively, the fifth recess 550 and the fifth opening 555 may be sequentially formed by different etching processes.

In embodiments of the disclosure, a third width W3 of a mouth of the fifth recess 550 may be smaller than a fourth width W4 of a mouth of the fifth opening 555.

Figure 24:
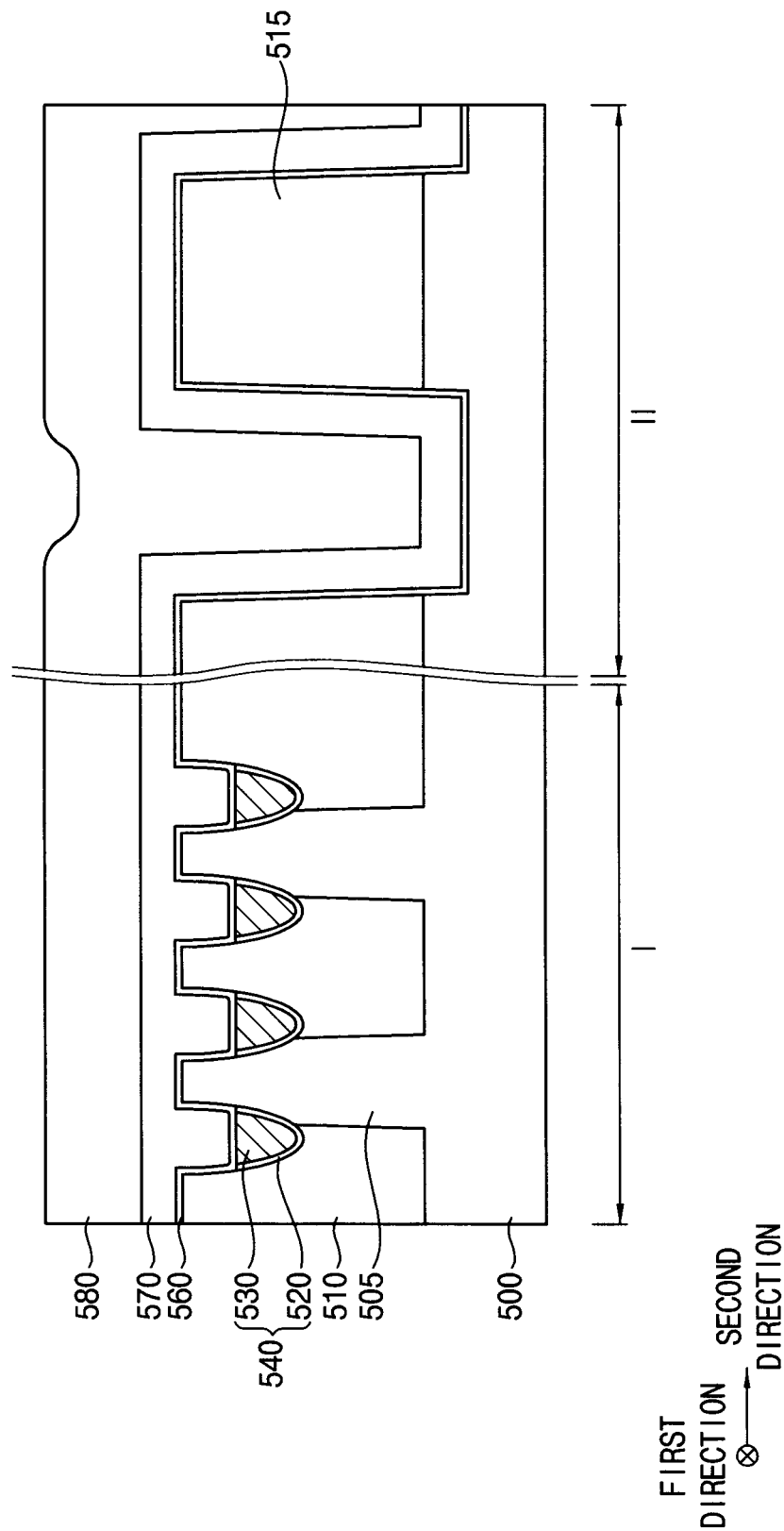

Referring to FIG. 24, processes substantially the same as or similar to the processes illustrated in FIG. 17 may be performed.

That is, an etch stop layer 560 may be formed on lower surfaces and sidewalls of the fifth recess 550 and the fifth opening 555, and upper surfaces of the active region 505 and the alignment key 515, and a first insulation layer 570 and a second insulation layer 580 may be sequentially stacked on the etch stop layer 560.

In embodiments of the disclosure, the etch stop layer 560 may be conformally formed on the lower surfaces and the sidewalls of the fifth recess 550 and the fifth opening 555, the first insulation layer 570 may be formed to fill the fifth recess 550, but to partially fill the fifth opening 555 on the lower surface and the sidewall of the fifth opening 555, and the second insulation layer 580 may fill a remaining portion of the fifth opening 555.

The first insulation layer 570 may include a material having a high insulating property and a low etching rate, e.g., silicon oxycarbide (SiOC), the etch stop layer 560 may include a material having a high etching selectivity with respect to the first insulation layer 570. e.g., a nitride such as silicon nitride (SiN), silicon oxynitride (SiON), silicon carbonitride (SiCN), etc., and the second insulation layer 580 may include a material having good gap fill characteristics, e.g., an oxide such as tetra ethyl ortho silicate (TEOS).

Figure 25:
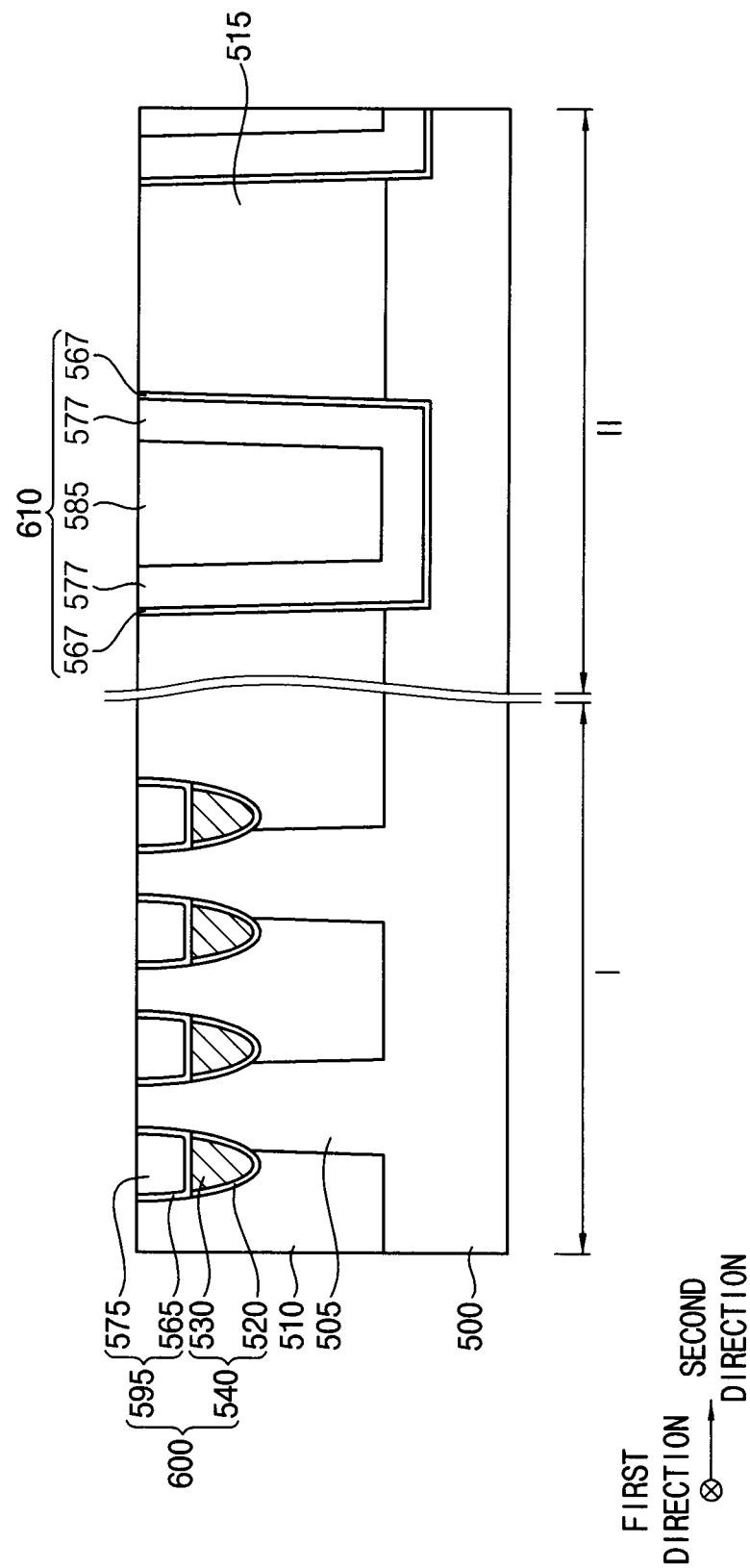

Referring to FIG. 25, processes substantially the same as or similar to the processes illustrated in FIGS. 17 to 19 may be performed.

That is, the second insulation layer 580 and the first insulation layer 570 may be planarized. Accordingly, a capping pattern 575 may be formed in the fifth recess 550, and a first filling pattern 585 and a second filling pattern 577 covering a lower surface and a sidewall of the first filling pattern 585 may be formed in the fifth opening 555.

In embodiments of the disclosure, the planarization process may include a CMP process, and the CMP process may be performed until an uppermost surface of the etch stop layer 560 may be exposed. The CMP process may be performed by using portions of the etch stop layer 560 on the upper surfaces of the active region 505 and the alignment key 515 as a polishing end point, and thus the alignment key 515 may not be removed by the CMP process and an original height of the alignment key 515 may be maintained.

In the CMP process, the fifth opening 555 surrounding the alignment key 515 may be filled with the etch stop layer 560 and the first and second insulation layers 570 and 580, and thus a relatively high pressure may not be applied to the fifth opening 555 when compared to the first region I of the substrate 500, and thus the planarization process may be uniformly performed.

The exposed portions of the etch stop layer 560 may be removed to form a first etch stop pattern 565 in the fifth recess 550, and a second etch stop pattern 567 may be formed in the fifth opening 555.

The exposed portions of the etch stop layer 560 may be removed by, e.g., a wet etching process or a CMP process. The etch stop layer 560 may include, e.g., a nitride, and may have a high etching selectivity with respect to the alignment key 515 including, e.g., an oxide. Accordingly, the alignment key 515 may not be removed in the removal process of the exposed portions of the etch stop layer 560, and the original height of the alignment key 515 may be maintained.

The first etch stop pattern 565 may be conformally formed on the lower surface and the sidewall of the fifth recess 550 exposing an upper surface of the gate electrode structure 540 on the first region I of the substrate 500, and the capping pattern 575 filling a remaining portion of the fifth recess 550 may be formed on the first etch stop pattern 565. The first etch stop pattern 565 and the capping pattern 575 together may form a capping structure 595. The gate electrode structure 540 and the capping structure 595 together may form a gate structure 600.

The second etch stop pattern 567 may be conformally formed on the lower surface and the sidewall of the fifth opening 555 surrounding the alignment key 515 on the second region II of the substrate 500 and exposing the upper surface of the substrate 500, the second filling pattern 577 may be formed on the second etch stop pattern 567, and the first filling pattern 585 filling a remaining portion of the fifth opening 555 may be formed on the second filling pattern 577. The second etch stop pattern 567, the first and second filling patterns 585 and 577 may form a filling structure 610.

A bit line, a contact plug, a capacitor, and the like may be formed on the above structures to complete the fabrication of the semiconductor device using the alignment key 515, which maintains the original height thereof.

The semiconductor device may include the active region 505 defined on the first region I of the substrate 500 by the isolation pattern 510 formed on the substrate 500 including the first and second regions I and II, the gate electrode structure 540 extending through the upper portions of the active region 505 and the isolation pattern 510, the capping structure 595 covering the upper surface of the gate electrode structure 540, the alignment key 515 formed on the second region II of the substrate 500 and including an insulating material, and the filling structure 610 formed on the second region II of the substrate 100 and covering a sidewall of the alignment key 515.

In embodiments of the disclosure, the capping structure 595 may include the capping pattern 575 and the first etch stop pattern 565 covering a lower surface and a sidewall of the capping pattern 575, and the filling structure 610 may include the first filling pattern 585, the second filling pattern 577 covering the lower surface and the sidewall of the first filling pattern 585, and the second etch stop pattern 567 covering a lower surface and a sidewall of the second filling pattern 577.

The above semiconductor device may be applied to various types of memory devices and systems including capping layers, which may cover upper surfaces of conductive patterns. For example, the semiconductor may be applied to logic devices such as central processing units (CPUs), main processing units (MPUs), or application processors (APs), or the like, including capping layers, which may cover upper surfaces of conductive patterns. Additionally, the semiconductor device may be applied to volatile memory devices such as DRAM devices or SRAM devices, or the like, or non-volatile memory devices such as flash memory devices, PRAM devices, MRAM devices, RRAM devices, or the like, including capping layers, which may cover upper surfaces of conductive patterns.

As described above, although the disclosure has been described with reference to embodiments of the disclosure, those skilled in the art will readily appreciate that many modifications are possible in the embodiments of the disclosure without materially departing from the novel teachings and advantages of the present disclosure.

What is claimed is:

1. A semiconductor device, comprising:
   a gate electrode structure disposed on a substrate;
   a capping structure covering an upper surface of the gate electrode structure, the capping structure comprising:
      a capping pattern; and
      a first etch stop pattern covering a lower surface and a sidewall of the capping pattern;
   an alignment key disposed on the substrate, the alignment key including an insulating material; and
   a filling structure disposed on the substrate, the filling structure covering a sidewall of the alignment key, and the filling structure comprising:
      a first filling pattern;
      a second filling pattern covering a lower surface and a sidewall of the first filling pattern; and
      a second etch stop pattern covering a lower surface and a sidewall of the second filling pattern.

2. The semiconductor device of claim 1, wherein the capping pattern and the second filling pattern include the same material, and the first etch stop pattern and the second etch stop pattern include the same material.

3. The semiconductor device of claim 2, wherein the capping pattern and the second filling pattern include silicon oxycarbide (SiOC), and the first etch stop pattern and the second etch stop pattern include silicon nitride (SiN), silicon oxynitride (SiON) or silicon carbonitride (SiCN).

4. The semiconductor device of claim 1, wherein the alignment key and the first filling pattern include an oxide.

5. The semiconductor device of claim 1, wherein a width of the filling structure is greater than a width of the capping structure.

6. The semiconductor device of claim 1, wherein a lower surface of the filling structure is lower than a lower surface of the alignment key.

7. The semiconductor device of claim 1, further comprising:
   a gate spacer covering a sidewall of the gate electrode structure,
   wherein the capping structure covers the upper surface of the gate electrode structure and an upper surface of the gate spacer.

8. The semiconductor device of claim 1, further comprising:
   a first contact plug extending through the capping structure to contact the upper surface of the gate electrode structure.

9. The semiconductor device of claim 1, wherein the gate electrode structure is formed on an active fin protruding from an upper surface of the substrate, and
   wherein the semiconductor device further comprises:
      a source/drain layer on the active fin, the active fin adjacent to the gate electrode structure; and
      a second contact plug contacting an upper surface of the source/drain layer.

10. The semiconductor device of claim 9, wherein the gate electrode structure comprises an interface pattern, a gate insulation pattern, a work function control pattern and a gate electrode sequentially stacked on an upper surface of the active fin.

11. A semiconductor device, comprising:
    a conductive structure disposed on a substrate;
    a capping structure covering an upper surface of the conductive structure, the capping structure comprising:
       a capping pattern containing silicon oxycarbide (SiOC); and
       a first etch stop pattern covering a lower surface and a sidewall of the capping pattern, the first etch stop pattern containing a material, which has a first etching selectivity with respect to the capping pattern;
    an alignment key on the substrate, the alignment key containing a material having a second etching selectivity lower than the first etching selectivity with respect to the capping pattern; and
    a filling structure disposed on the substrate, the filling structure covering a sidewall of the alignment key, and the filling structure comprising:
       a first filling pattern;
       a second filling pattern covering a lower surface and a sidewall of the first filling pattern, the second filling pattern and the capping pattern containing a same material; and
       a second etch stop pattern covering a lower surface and a sidewall of the second filling pattern, the first etch stop pattern and the second etch stop pattern containing a same material.

12. The semiconductor device of claim 11, wherein the first etch stop pattern and the second etch stop pattern include silicon nitride (SiN), silicon oxynitride (SiON) or silicon carbonitride (SiCN).

13. The semiconductor device of claim 11, the alignment key and the first filling pattern include an oxide.

14. The semiconductor device of claim 11, wherein a width of the filling structure is greater than a width of the capping structure.

15. The semiconductor device of claim 11, wherein a lower surface of the filling structure is lower than a lower surface of the alignment key.

16. A semiconductor device, comprising:
    an active region disposed on a substrate, the active region defined by an isolation pattern on the substrate;
    a gate electrode structure disposed on the active region and the isolation pattern;
    a capping structure covering an upper surface of the gate electrode structure, the capping structure comprising:
       a capping pattern containing silicon oxycarbide (SiOC); and
       an etch stop pattern covering a lower surface and a sidewall of the capping pattern, the etch stop pattern containing a material, the material comprising silicon nitride (SiN), silicon oxynitride (SiON) or silicon carbonitride (SiCN); and
    a source/drain layer on the active region adjacent to the gate electrode structure.

17. The semiconductor device of claim 16, further comprising:
- a gate spacer covering a sidewall of the gate electrode structure,
- wherein the capping structure covers the upper surface of the gate electrode structure and an upper surface of the gate spacer.

18. The semiconductor device of claim 16, further comprising:
- a first contact plug extending through the capping structure to contact the upper surface of the gate electrode structure; and
- a second contact plug contacting an upper surface of the source/drain layer.

19. The semiconductor device of claim 16, wherein the active region includes:
- an active fin protruding from an upper surface of the substrate, the active fin having an upper surface higher than an upper surface of the isolation pattern.

20. The semiconductor device of claim 19, wherein the gate electrode structure includes an interface pattern, a gate insulation pattern, a work function control pattern and a gate electrode sequentially stacked on the upper surface of the active fin.

\* \* \* \* \*